United States Patent
Jun et al.

(10) Patent No.: US 9,606,730 B2
(45) Date of Patent: Mar. 28, 2017

(54) SYSTEM AND METHOD INCLUDING THREE DIMENSIONAL NONVOLATILE MEMORY DEVICE AND RANDOM ACCESS MEMORY

(71) Applicants: Byung Hei Jun, Seoul (KR); Donghun Kwak, Hwaseong-si (KR)

(72) Inventors: Byung Hei Jun, Seoul (KR); Donghun Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 181 days.

(21) Appl. No.: 13/799,203

(22) Filed: Mar. 13, 2013

(65) Prior Publication Data

US 2016/0253099 A1    Sep. 1, 2016

(30) Foreign Application Priority Data

May 4, 2012   (KR) ........................ 10-2012-0047503
Jul. 2, 2012   (KR) ........................ 10-2012-0071715

(51) Int. Cl.
| | |
|---|---|
| G06F 12/02 | (2006.01) |
| G06F 3/06 | (2006.01) |
| G11C 16/10 | (2006.01) |
| G11C 7/10 | (2006.01) |
| G11C 16/06 | (2006.01) |
| G11C 16/34 | (2006.01) |
| G06F 12/06 | (2006.01) |
| G11C 11/56 | (2006.01) |

(52) U.S. Cl.
CPC ............ *G06F 3/0605* (2013.01); *G06F 3/061* (2013.01); *G06F 3/064* (2013.01); *G06F 3/0656* (2013.01); *G06F 3/0679* (2013.01); *G06F 12/0246* (2013.01); *G06F 12/0292* (2013.01); *G06F 12/0638* (2013.01); *G11C 7/10* (2013.01); *G11C 16/06* (2013.01); *G11C 16/10* (2013.01); *G11C 16/3454* (2013.01); *G06F 2212/1016* (2013.01); *G06F 2212/1041* (2013.01); *G06F 2212/205* (2013.01); *G11C 11/5628* (2013.01)

(58) Field of Classification Search
CPC ............ G06F 12/0238; G06F 12/0246; G11C 11/5628
USPC ................................................. 711/103, 155
See application file for complete search history.

(56) References Cited

U.S. PATENT DOCUMENTS

| | | | |
|---|---|---|---|
| 7,369,436 | B2 | 5/2008 | Forbes |
| 7,450,426 | B2 | 11/2008 | Li et al. |
| 7,554,859 | B2 | 6/2009 | Choi |
| 7,561,467 | B2 | 7/2009 | Kang et al. |
| 7,679,133 | B2 | 3/2010 | Son et al. |
| 7,743,230 | B2 | 6/2010 | Polansky et al. |
| 7,852,659 | B2 | 12/2010 | Kang et al. |
| 7,865,658 | B2 | 1/2011 | Lasser et al. |
| 8,046,525 | B2 | 10/2011 | Chae et al. |

(Continued)

FOREIGN PATENT DOCUMENTS

JP   2009054246 A   3/2009

*Primary Examiner* — Than Nguyen
(74) *Attorney, Agent, or Firm* — Volentine & Whitt, PLLC

(57) ABSTRACT

A program method for a memory system including a three-dimensional nonvolatile memory having multi-level memory cells and a random access memory. The method uses the random access memory to variously store selected bits of multi-bit data during the programming of a row of memory cells in the three-dimensional nonvolatile memory.

20 Claims, 37 Drawing Sheets

(56) References Cited

U.S. PATENT DOCUMENTS

| | | |
|---|---|---|
| 8,145,830 B2 | 3/2012 | Lasser |
| 8,156,277 B2 | 4/2012 | Kitahara |
| 2008/0074928 A1* | 3/2008 | Choi .................. 365/185.17 |
| 2010/0097842 A1 | 4/2010 | Hwang |
| 2010/0302856 A1 | 12/2010 | Ahn |
| 2011/0222342 A1* | 9/2011 | Yoon et al. ............ 365/185.03 |

* cited by examiner

Fig. 24

| Column | Address | Data | | |
|---|---|---|---|---|
| 0 | 00h | LSB page | CSB page | MSB page |
| 1 | 01h | LSB page | CSB page | MSB page |
| 2 | 02h | LSB page | CSB page | MSB page |
| 3 | 03h | LSB page | CSB page | MSB page |
| 4 | 04h | LSB page | CSB page | MSB page |
| 5 | 05h | LSB page | CSB page | MSB page |
| 6 | 06h | LSB page | CSB page | MSB page |
| 7 | 07h | LSB page | CSB page | MSB page |

Fig. 26

| Column | Address | Data | | Address | Data |
|---|---|---|---|---|---|
| 0 | 00h | LSB page | CSB page | 01h | MSB page |
| 1 | 02h | LSB page | CSB page | 03h | MSB page |
| 2 | 04h | LSB page | CSB page | 05h | MSB page |
| 3 | 06h | LSB page | CSB page | 07h | MSB page |
| 4 | 08h | LSB page | CSB page | 09h | MSB page |
| 5 | 10h | LSB page | CSB page | 11h | MSB page |
| 6 | 12h | LSB page | CSB page | 13h | MSB page |
| 7 | 14h | LSB page | CSB page | 15h | MSB page |

Fig. 28

| Column Address | Data | Column Address | Data | Column Address | Data |
|---|---|---|---|---|---|
| 00h | LSB page | 01h | CSB page | 02h | MSB page |
| 03h | LSB page | 04h | CSB page | 05h | MSB page |
| 06h | LSB page | 07h | CSB page | 08h | MSB page |
| 09h | LSB page | 10h | CSB page | 11h | MSB page |
| 12h | LSB page | 13h | CSB page | 14h | MSB page |
| 15h | LSB page | 16h | CSB page | 17h | MSB page |
| 18h | LSB page | 19h | CSB page | 20h | MSB page |
| 21h | LSB page | 22h | CSB page | 23h | MSB page |

Fig. 30

| Column Address | Data | Column Address | Data | |
|---|---|---|---|---|
| 00h | LSB page | 01h | CSB page | MSB page |
| 02h | LSB page | 03h | CSB page | MSB page |
| 04h | LSB page | 05h | CSB page | MSB page |
| 06h | LSB page | 07h | CSB page | MSB page |
| 08h | LSB page | 09h | CSB page | MSB page |
| 10h | LSB page | 11h | CSB page | MSB page |
| 12h | LSB page | 13h | CSB page | MSB page |
| 14h | LSB page | 15h | CSB page | MSB page |

SYSTEM AND METHOD INCLUDING THREE DIMENSIONAL NONVOLATILE MEMORY DEVICE AND RANDOM ACCESS MEMORY

CROSS-REFERENCE TO RELATED APPLICATIONS

A claim for priority under 35 U.S.C. §119 is made to Korean Patent Application No. 10-2012-0071715 filed Jul. 2, 2012 and Korean Patent Application No. 10-2012-0047503, the subject matters of which are hereby incorporated by reference.

BACKGROUND

The inventive concept relates to memory systems, semiconductor memory devices, and programming methods for semiconductor memory devices. More particularly, the inventive concept relates to memory systems including a three-dimensional, nonvolatile memory device and methods of programming same.

Semiconductor memory devices may be classified as volatile and nonvolatile according to their operating characteristics. Volatile memory devices lose stored data in the absence of applied power, and include the static RAM (SRAM), dynamic RAM (DRAM), synchronous DRAM (SDRAM), and the like. Nonvolatile memory devices are able to retain stored data in the absence of applied power, and include the read only memory (ROM), programmable ROM (PROM), electrically programmable ROM (EPROM), electrically erasable and programmable ROM (EEPROM) such as flash memory, phase-change RAM (PRAM), magnetic RAM (MRAM), resistive RAM (RRAM), ferroelectric RAM (FRAM), and the like.

Flash memory has become and particularly significant type of nonvolatile memory and includes NOR type and NAND type.

In recent years, so-called three-dimensional memory architectures and structures have been proposed to further increase the integration density of flash memory. Generally speaking, three-dimensional flash memory includes one or more semiconductor structure(s) in which memory cells are stacked on a principle substrate. Compared with a conventional two-dimensional (or planar) memory, three-dimensional memory offers advantages in integration and cost. However, the reliability of the three-dimensional memory must be improved.

SUMMARY

In one embodiment, the inventive concept provides a program method for a memory system including a three-dimensional nonvolatile memory having a page buffer and multi-level memory cells arranged along a row direction, and a random access memory. The method includes; receiving externally provided program data, determining whether the received program data is whole data associated with the memory cells and corresponding to multi-page data, and upon determining that the received program data is whole data programming the program data by loading the multi-page data to the page buffer and then simultaneously programming the bits of the multi-page data from the page buffer to the memory cells, else storing the received program data in the random access memory.

In another embodiment, the inventive concept provides a program method for a memory system including a controller, a three-dimensional nonvolatile memory having a page buffer and multi-level memory cells arranged along a row direction, and a random access memory. The method includes; receiving externally provided, multi-page, program data in the controller, storing the received program data in the random access memory until the received program data stored in the random access memory is whole data associated with the memory cells and corresponding to the multi-page data, loading the multi-page data to the page buffer, and simultaneously programming the multi-page data from the page buffer to the memory cells.

In another embodiment, the inventive concept provides a program method for a memory system including a controller, a three-dimensional nonvolatile memory having a page buffer and N-bit memory cells arranged along a row direction, and a random access memory. The method comprises; receiving a first bit of N-bit data in the controller and storing the first bit of the N-bit data in the random access memory, after storing the first bit of the N-bit data in the random access memory, receiving a second bit of the N-bit data in the controller, wherein the combination of at least the first bit and second bit of the N-bit data is whole data associated with the memory cells and corresponding to multi-page data, loading the multi-page data to the page buffer, wherein the loading of the multi-page data to the page buffer includes transferring the first bit of the N-bit data from the random access memory to the page buffer, and directly transferring the second bit of the N-bit data from the controller to the page buffer by bypassing the random access memory, and simultaneously programming the multi-page data from the page buffer to the memory cells.

In another embodiment, the inventive concept provides a program method for a memory system including a controller, a three-dimensional nonvolatile memory having a page buffer and N-bit memory cells arranged along a row direction, and a random access memory. The method comprises; receiving a first bit of N-bit data in the controller, directly loading the first bit of N-bit data to the page buffer without passing through the random access memory, and then programming the first bit of the N-bit data to the memory cells, after programming the first bit of the N-bit data to the memory cells, receiving a second bit of the N-bit data in the controller and storing the second bit of the N-bit data in the random access memory, after storing the second bit of the N-bit data in the random access memory, transferring the second bit of the N-bit data from the random access memory to the page buffer, receiving a third bit of the N-bit data in the controller and directly loading the third bit of N-bit data to the page buffer without passing through the random access memory, wherein the combination of the first bit, the second bit and the third bit of the N-bit data is whole data associated with the memory cells and corresponds to multi-page data, and simultaneously programming the second bit and third bit of the N-bit data from the page buffer to the memory cells.

In another embodiment, the inventive concept provides a program method for a memory system including a controller, a three-dimensional nonvolatile memory having a page buffer and N-bit memory cells arranged along a row direction, and a random access memory. The method comprises; receiving a first bit of N-bit data in the controller and storing the first bit of N-bit data in the random access memory, receiving a second bit of N-bit data in the controller and storing the second bit of N-bit data in the random access memory, simultaneously loading the first bit and second bit of the N-bit data from the random access memory to the page buffer, and then simultaneously programming the first bit and second bit of the N-bit data from the page buffer to the memory cells, after simultaneously programming the first bit and second bit of the N-bit data from the page buffer to the memory cells, receiving a third bit of N-bit data in the controller, storing the third bit of N-bit data in the random access memory, loading the third bit of the N-bit data from the random access memory to the page buffer, and then programming the third bit of the N-bit data from the page buffer to the memory cells, wherein the combination of the first bit, the second bit and the third bit of the N-bit data is whole data associated with the memory cells and corresponds to multi-page data.

BRIEF DESCRIPTION OF THE DRAWINGS

The above and other objects and features of the inventive concept will become more apparent upon consideration of the following description with reference to the accompanying drawings.

FIGS. 23, 24, 25, 26, 27, 28, 29, 30 and 31 are timing diagrams illustrating examples of signals that may be transferred to a three-dimensional nonvolatile memory from a controller during programming in relation to certain embodiments of the inventive concept, and tables listing program addressing approaches for a three-dimensional nonvolatile memory corresponding to certain exemplary program sequences.

DETAILED DESCRIPTION

Figure 1:
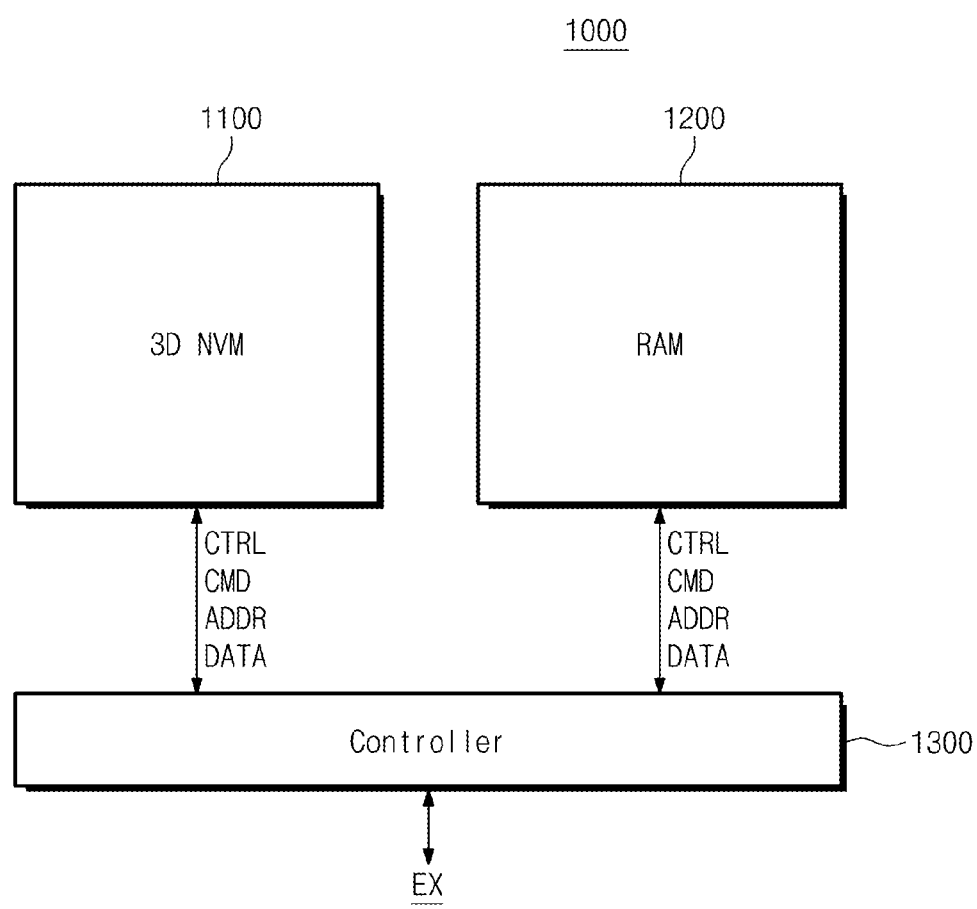
FIG. 1 is a block diagram illustrating a memory system according to an embodiment of the inventive concept.

Embodiments of the inventive concept will now be described in some additional detail with reference to the accompanying drawings. The inventive concept may, however, be embodied in various different forms and should not be construed as being limited to only the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the written description and drawings. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram generally illustrating a memory system according to an embodiment of the inventive concept. Referring to FIG. 1, a memory system 1000 may include a three-dimensional nonvolatile memory 1100, a random access memory 1200, and a controller 1300.

The three-dimensional nonvolatile memory 1100 may receive control signals CTRL, a command CMD, and an address ADDR from the controller 1300 and exchange data with the controller 1300. The three-dimensional nonvolatile memory 1100 may include a plurality of memory cells which are arranged in a row direction and a column direction and in a height direction perpendicular to the substrate. That is, the three-dimensional nonvolatile memory 1100 may have a three-dimensional structure. The three-dimensional nonvolatile memory 1100 may include at least one of ROM, PROM, EPROM, EEPROM, flash memory, PRAM, MRAM, ReRAM, or FRAM. For ease of description, the inventive concept will be described using a flash memory, in particular, a three-dimensional NAND flash memory. However, the inventive concept is not limited thereto.

The random access memory 1200 may receive control signals CTRL, a command CMD, and an address ADDR from the controller 1300 and exchange data with the controller 1300. The random access memory 1200 may include at least one of DRAM, SRAM, PRAM, MRAM, RRAM, or FRAM.

The controller 1300 may control the three-dimensional nonvolatile memory 1100 and the random access memory 1200. The controller 1300 may communicate with an external device EX. For example, the controller 1300 may communicate with an external host. The controller 1300 may program data received from the external device EX at the three-dimensional nonvolatile memory 1100 or the random access memory 1200, and may output data read from the three-dimensional nonvolatile memory 1100 or the random access memory 1200 to the external device EX.

Figure 2:
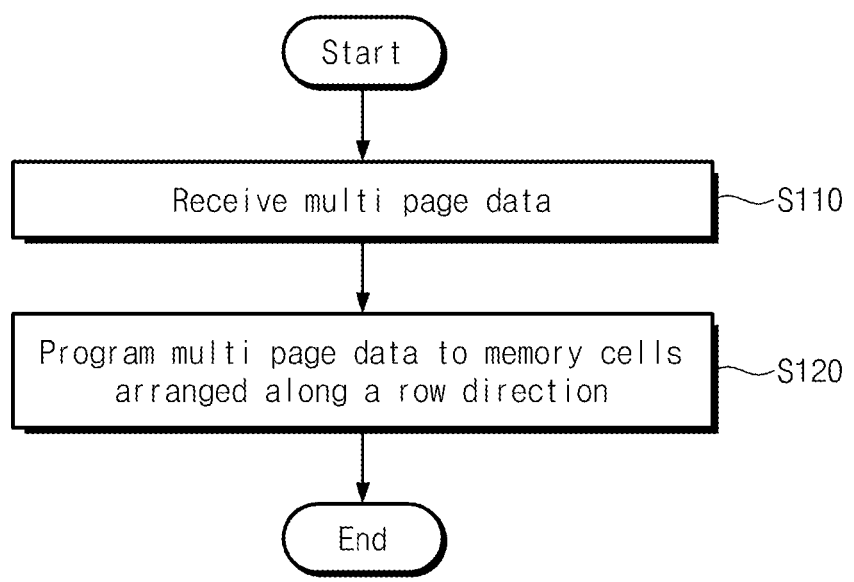
FIG. 2 is a flow chart generally summarizing a program method according to an embodiment of the inventive concept.

FIG. 2 is a flow chart summarizing a program method according to an embodiment of the inventive concept. First, multi-page data is received (S110). The multi-page data may include data to be programmed at memory cells arranged along a row direction. The multi-page data may include two or more bits to be programmed at a memory cell. For example, the multi-page data may include a least significant bit to a most significant bit to be programmed at memory cells arranged along a row direction.

Then, the multi-bit data may be programmed to the memory cells arranged along the row direction (S120). The multi-bit data may be simultaneously programmed to the memory cells arranged along the row direction.

Figure 3:
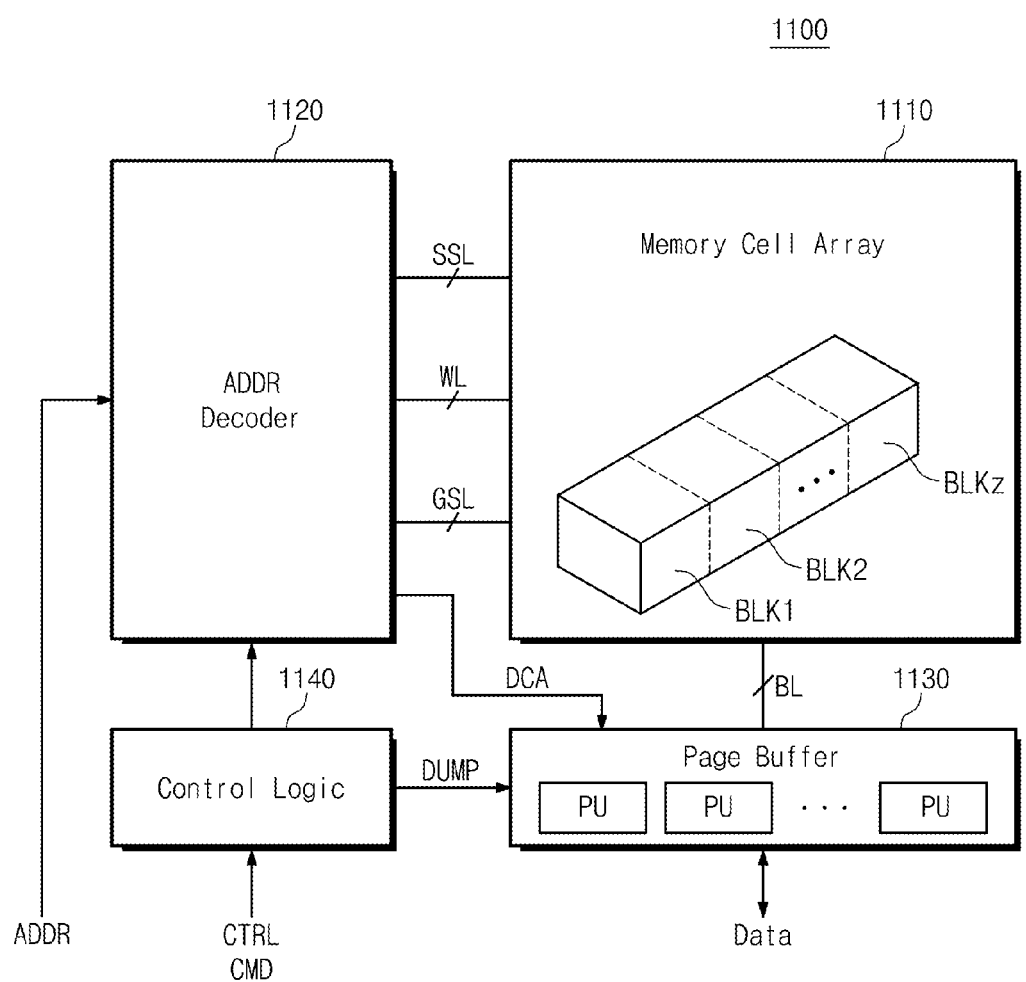
FIG. 3 is a block diagram further illustrating the three-dimensional nonvolatile memory 1100 of FIG. 1.

FIG. 3 is a block diagram further illustrating the three-dimensional nonvolatile memory 1100 of FIG. 1 according to certain embodiments of the inventive concept. Referring to FIGS. 1 and 3, the three-dimensional nonvolatile memory 1100 may include a memory cell array 1110, an address decoder 1120, a page buffer 1130, and control logic 1140.

The memory cell array 1110 may be connected to the address decoder 1120 through word lines WL, string selection lines SSL, and ground selection lines GSL and to the page buffer 1130 through bit lines BL. The memory cell array 1110 may include a plurality of memory blocks BLK1 to BLKz, each of which includes a plurality of memory cells. In each of the memory blocks BLK1 to BLKz, the memory cells may be arranged on the substrate along a row direction and a column direction and in a height direction perpendicular to the substrate so as to have a three-dimensional structure. Each memory cell may store two or more bits.

The address decoder 1120 may be connected to the memory cell array 1110 through the word lines WL, the string selection lines SSL, and the ground selection lines GSL. The address decoder 1120 may operate responsive to a control of the control logic 1140. The address decoder 1120 may receive an address ADDR from an external device.

The address decoder 1120 may be configured to decode a row address of the input address ADDR. The address decoder 1120 may select the word lines WL, the string selection lines SSL, and the ground selection lines GSL using the decoded row address. The address decoder 1120 may be configured to decode a column address of the input address ADDR. The decoded column address DCA may be transferred to the page buffer 1130. For example, the address decoder 1120 may include components such as a row decoder, a column decoder, an address buffer, and so on.

The page buffer 1130 may be connected to the memory cell array 1110 through the bit lines BL. The page buffer 1130 may operate responsive to a control of the control logic 1140. The page buffer 1130 may select the bit lines BL in response to the decoded column address DCA.

The page buffer 1130 may receive data from a controller 1300 to write it at the memory cell array 1110. The page buffer 1130 may read data from the memory cell array 1110 to transfer it to the controller 1300. The page buffer 1130 may read data from a first storage region of the memory cell array 1110 to write it at a second storage region of the memory cell array 1110. For example, the page buffer 1130 may be configured to perform a copy-back operation.

The page buffer 1130 may include a plurality of page buffer units PU, which are connected to the bit lines BL, respectively. The page buffer units PU may bias the bit lines BL at a program operation and sense voltages of the bit lines BL at a read operation.

The control logic 140 may be connected to the address decoder 1120 and the page buffer 1130. The control logic 1140 may be configured to control an overall operation of the three-dimensional nonvolatile memory 1100. The control logic 1140 may operate responsive to control signals CTRL and a command CMD transferred from an external device.

Figure 4:
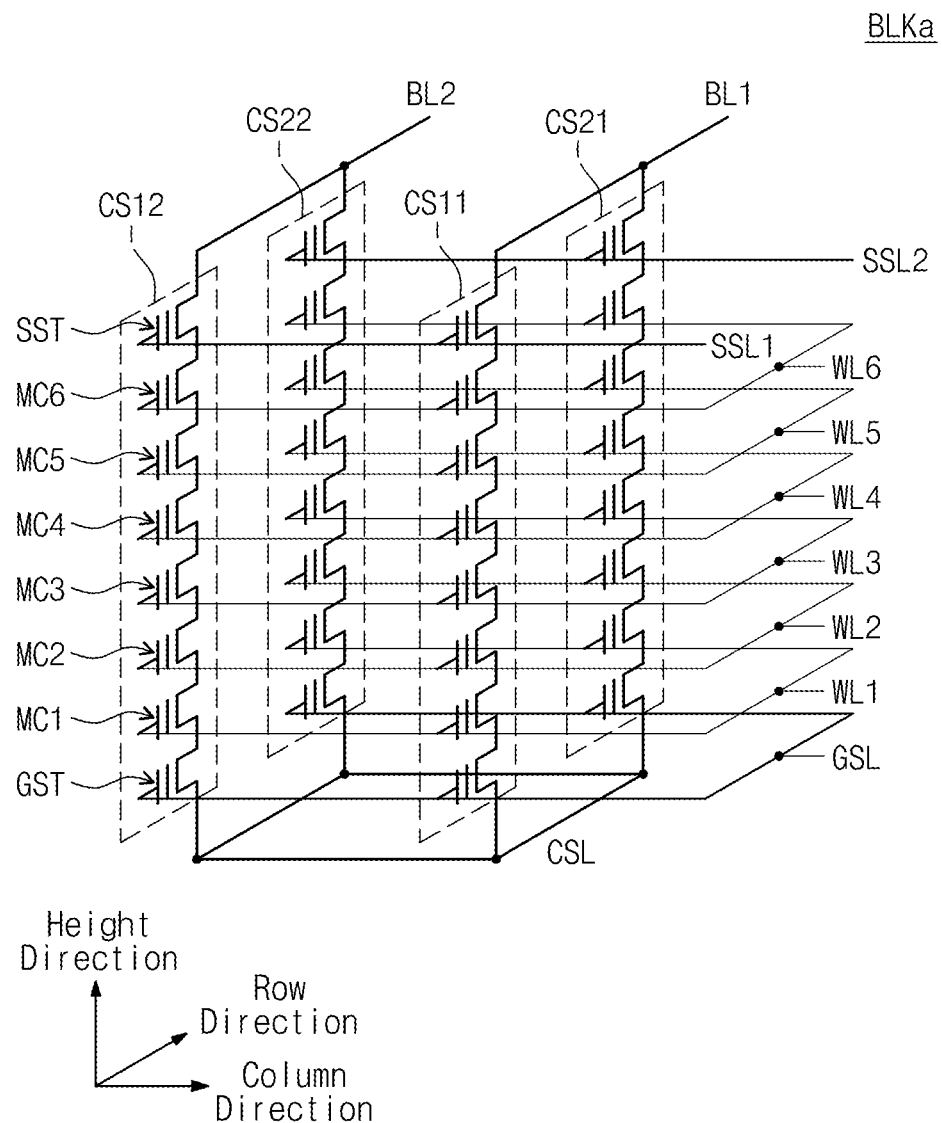
FIG. 4 is a circuit diagram further illustrating one memory block among the plurality of memory blocks in the memory cell array of FIG. 3.

FIG. 4 is a circuit diagram further illustrating one memory block among the plurality of memory blocks forming the memory cell array of FIG. 3. Referring to FIG. 4, a memory block may include cell strings CS11, CS12, CS21, and CS22. Each of the cell strings CS11, CS12, CS21, and CS22 may include a string selection transistor SST, a ground selection transistor GST, and memory cells MC1 to MC6 connected between the string selection transistor SST and the ground selection transistor GST.

In the cell strings CS11, CS12, CS21, and CS22, control gates of the ground selection transistors GST may be connected in common to a ground selection line GSL. One ends of the ground selection transistors GST may be connected with the memory cells MC1, respectively. The other ends of the ground selection transistors GST may be connected in common to a common source line CSL.

In the cell strings CS11, CS12, CS21, and CS22, the memory cells MC1 may be connected in common to a word line WL1, the memory cells MC2 may be connected in common to a word line WL2, the memory cells MC3 may be connected in common to a word line WL3, the memory cells MC4 may be connected in common to a word line WL4, the memory cells MC5 may be connected in common to a word line WL5, and the memory cells MC6 may be connected in common to a word line WL6.

Control gates of the string selection transistors SST in the cell strings CS11 and CS12 may be connected to a string selection line SSL1, and control gates of the string selection transistors SST in the cell strings CS21 and CS22 may be connected to a string selection line SSL2.

One ends of the string selection transistors SST in the cell strings CS11 and CS21 may be connected to a bit line BL1, and the other ends of the string selection transistors SST in the cell strings CS11 and CS21 may be connected to the memory cells MC6. One ends of the string selection transistors SST in the cell strings CS12 and CS22 may be connected to a bit line BL2, and the other ends of the string selection transistors SST in the cell strings CS12 and CS22 may be connected to the memory cells MC6.

Below, rows, columns, and heights will be defined for a brief description. A direction along which the string selection lines SSL1 and SSL2 extend may be a row direction. The cell strings CS11 and CS12 may be arranged along the row direction to form a first row. The cell strings CS21 and CS22 may be arranged along the row direction to form a second row.

A direction along which the bit lines BL1 and BL2 extend may be a column direction. The cell strings CS11 and CS21 may be arranged along the column direction to form a first column. The cell strings CS12 and CS22 may be arranged along the column direction to form a second column.

A direction from the ground selection transistors GST to the string selection transistors SST may be a height.

The memory cells MC1 to MC6 may form a three-dimensional structure in which they are arranged along a row direction and a column direction and stacked along a height direction. Memory cells at the same height may be connected in common to a word line. Memory cells at different heights may be connected to different word lines. String selection transistors SST in the same row may be connected in common to one string selection line SSL1 or SSL2, and string selection transistors SST in different rows may be connected in common to the string selection line SSL1 and SSL2, independently. String selection transistors SST in the same column may be connected to the same bit line BL1 or BL2, and string selection transistors SST in different columns may be connected to different bit lines BL1 and BL2, independently.

Each of the memory cells MC1 to MC6 may store two or more bits. That is, the memory cells MC1 to MC6 may be multi-level cells.

In example embodiments, an example in which the memory block BLKa includes four cell strings CS11, CS12, CS21, and CS22 is illustrated in FIG. 4. However, the number of cell strings in the memory block BLKa may not be limited to this disclosure. Two or more cell strings may be provided along a row or column direction. An example in which each cell string includes six memory cells MC1 to MC6. However, the number of memory cells in each cell string may not be limited to this disclosure. Each cell string may include two or more memory cells along a height direction.

In example embodiments, an example in which ground selection transistors GST may be connected in common to one ground selection line GSL is illustrated in FIG. 4. Like the string selection transistors SST, however, a structure of the memory block BLKa may be changed such that ground selection transistors GST in the same row are connected in common to one ground selection line and ground selection transistors GST in different rows are connected to different ground selection lines.

In example embodiments, an example in which each cell string includes one string selection transistor SST and one ground selection transistor GST is illustrated in FIG. 4. However, each cell string may be configured to include two or more string selection transistors or two or more ground selection transistors.

At least one of the memory cells MC1 to MC6 in each cell string may be used as a dummy memory cell.

Figure 5:
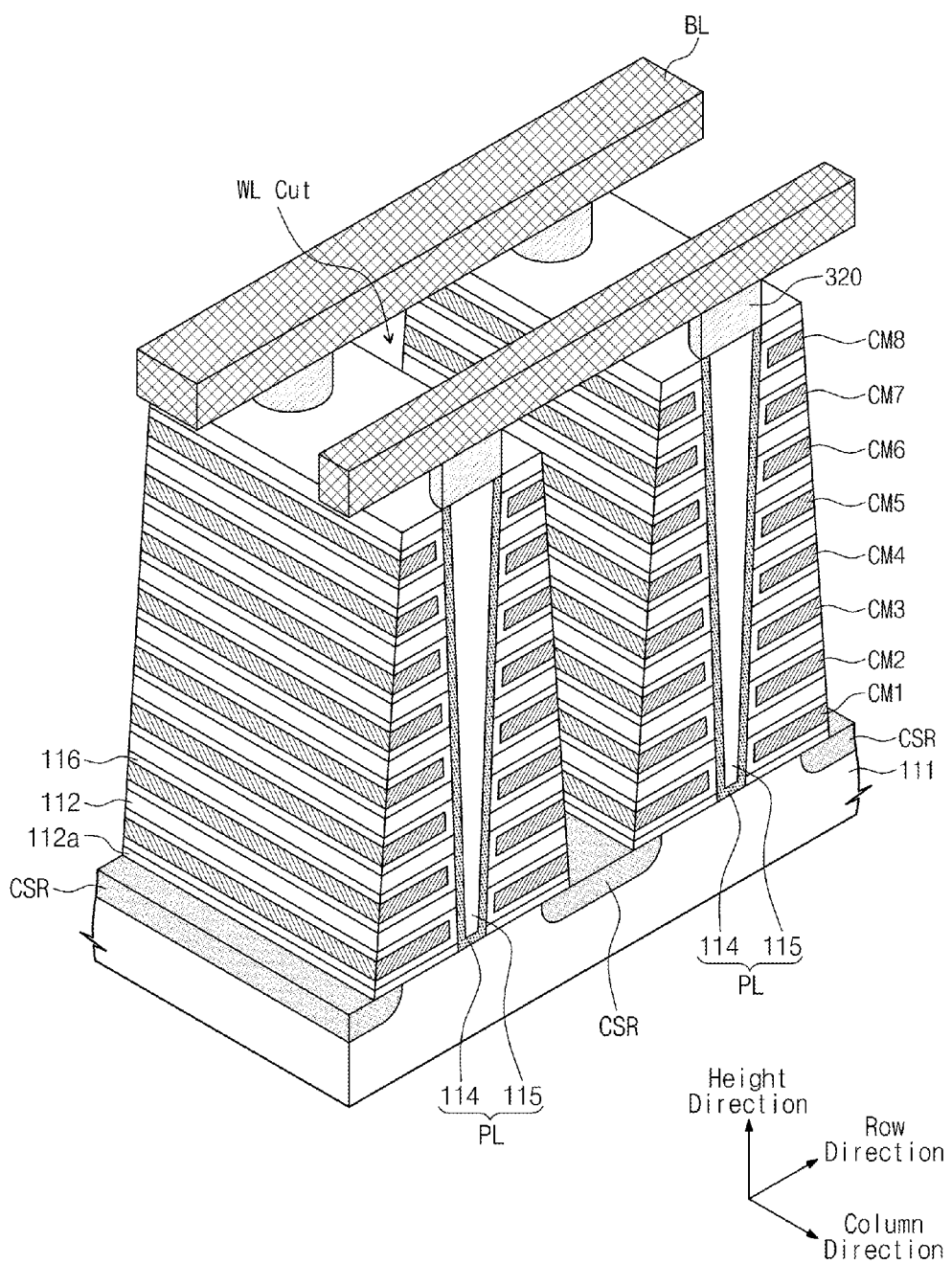
FIG. 5 is a perspective view illustrating one possible structure for the memory block of FIG. 4.

FIG. 5 is a perspective view illustrating one possible structure for implementing the memory block of FIG. 4. Referring to FIGS. 4 and 5, a plurality of common source regions CSR extending along a row direction may be provided in a substrate 111. The common source regions CSR may be spaced apart from one another along a column direction. The common source regions CSR may be connected in common to form a common source line. The common source lines CSR may include an n-type semiconductor material.

Between the common source regions CSR, a plurality of insulation materials 112 and 112*a* may be provided sequentially on the substrate 111 along a height direction (i.e., a direction perpendicular to the substrate 111). The insulation materials 112 and 112*a* may be spaced apart along the height direction. The insulation materials 112 and 112*a* may include an insulation material such as a semiconductor oxide film. The insulation material 112a contacting with the substrate 111 may be thinner in thickness than those of other insulation materials 112.

Between the common source regions CSR, a plurality of pillars PL may be arranged to be spaced apart from one another along the row direction and the column direction and penetrate the plurality of insulation materials 112 and 112a along the height direction. For example, the pillars PL may contact with the substrate 111 through the insulation materials 112 and 112a. Each of the pillars PL may include a channel film 114 and an inner material 115. The channel films 114 may include a p-type semiconductor material or an intrinsic semiconductor material, respectively. The inner materials 115 may include an insulation material or air gap, respectively.

Between the common source regions CSR, information storage films 116 may be provided on exposed surfaces of the insulation materials 112 and 112a and the pillars PL. The information storage films 116 may store information by trapping or discharging charges. The information storage films 116 may include ONA (oxide-nitride-aluminum) or ONO (oxide-nitride-oxide).

Between the common source regions CSR and between the insulation materials 112 and 112a, conductive materials CM1 to CM8 may be provided on exposed surfaces of the information storage films 116. The conductive material CM8 of the conductive materials CM1 to CM8 may be separated by a string selection line cut. The string selection line cut may extend along the row direction to separate the conductive material CM8 along the column direction. The conductive materials CM1 to CM8 may include a metallic conductive material, respectively.

The information storage films 116 provided on an upper surface of an insulation material placed at the uppermost layer from among the insulation materials 112 and 112a can be removed. For example, the information storage films 116 provided at sides opposite to the pillars PL from among sides of the insulation materials 112 and 112a can be removed.

A plurality of drains 320 may be provided on the plurality of pillars PL, respectively. The drains 320 may include an n-type semiconductor material (e.g., silicon). The drains 320 can be extended to the upside of the channel films 114 of the pillars PL.

Bit lines BL extending in the column direction may be provided on the drains 320 so as to be spaced apart from one another along the row direction. The bit lines BL may be coupled with the drains 320. In example embodiments, the drains 320 and the bit lines BL may be connected via contact plugs (not shown). The bit lines BL may include a metallic conductive material, respectively.

The plurality of pillars PL may form a plurality of cell strings together with the information storage films 116 and the plurality of conductive materials CM1 to CM8. Each of the pillars PL may form a cell string with information storage films 116 and adjacent conductive materials CM1 to CM8.

The conductive material CM1 may act as a ground selection line GSL and as control gates of the ground selection transistors GST. The information storage films 116 and portions, adjacent to the conductive material CM1, of the channel films 114 may act as a blocking insulation film, a charge trap film, a tunneling insulation film, and a channel.

The conductive material CM2 may be used as a word line WL1 and as gate controls of the memory cells MC1. The conductive material CM3 may be used as a word line WL2 and as gate controls of the memory cells MC2. The conductive material CM4 may be used as a word line WL3 and as gate controls of the memory cells MC3. The conductive material CM5 may be used as a word line WL4 and as gate controls of the memory cells MC4. The conductive material CM6 may be used as a word line WL5 and as gate controls of the memory cells MC5. The conductive material CM7 may be used as a word line WL6 and as gate controls of the memory cells MC6.

The conductive material CM8 may be used as string selection lines SSL1 and SSL2 and as control gates of the string selection transistors SST.

The memory cells MC1 to MC6 may have a three-dimensional structure to be arranged on the substrate 111 along the row direction and the column direction and to be stacked in a height direction perpendicular to the substrate 111.

Figure 6:
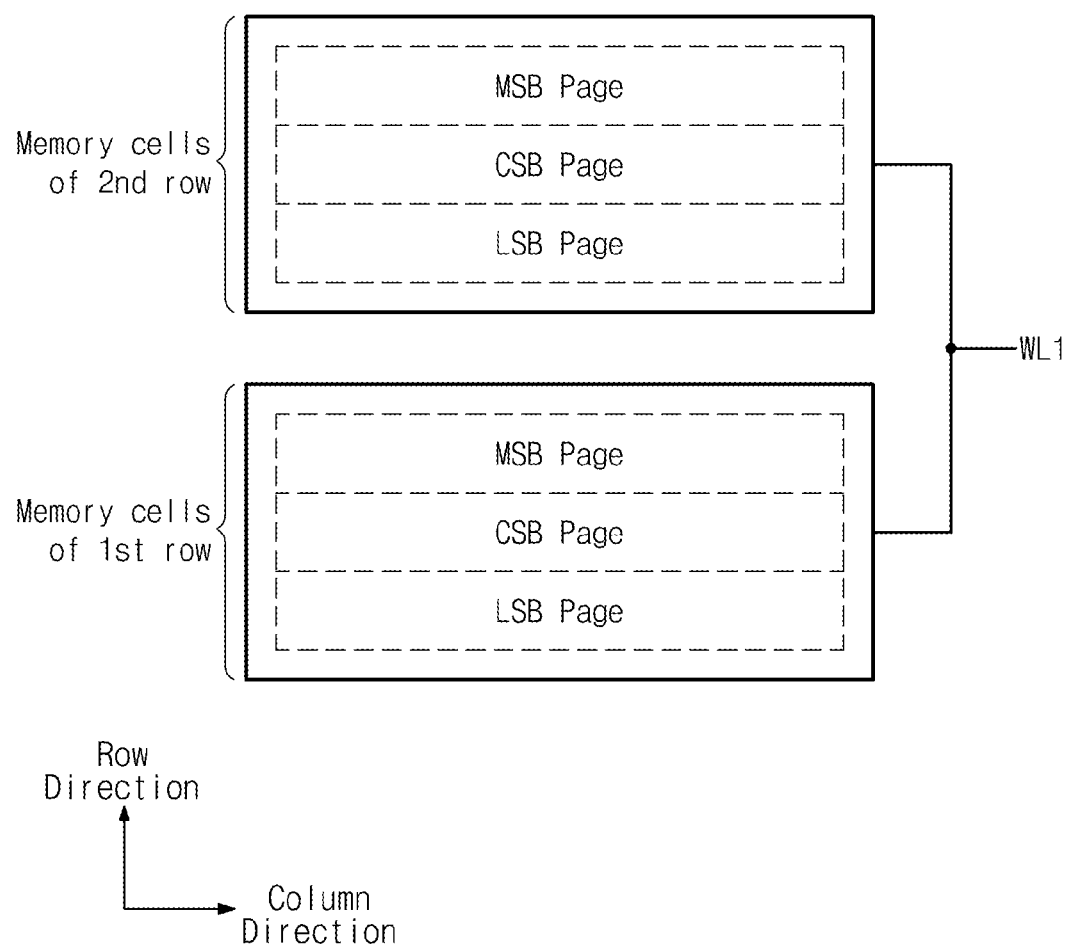
FIG. 6 is a diagram illustrating a page structure for memory cells connected to a word line in the memory block of FIG. 4.

FIG. 6 is a diagram illustrating one possible page structure for a group of memory cells connected to one of the word lines illustrated in FIG. 4. In certain embodiments, each of memory cells MC1 to MC6 may be configured to store at least significant bit (LSB), a central significant bit (CSB), and a most significant bit (MSB). However, the number of bits stored by each memory cell is not limited to three. For example, other memory cell may be configured to store two, four, or more than four bits.

Referring to FIGS. 4 to 6, LSBs stored in memory cells MC1, belonging to a first row, memory cells MC1 connected to a word line WL1 may form an LSB page, CSBs stored in the memory cells MC1 may form a CSB page, and MSBs stored in the memory cells MC1 may form an MSB page.

LSBs stored in memory cells MC1, belonging to a second row, memory cells MC1 connected to a word line WL1 may form an LSB page, CSBs stored in the memory cells MC1 may form a CSB page, and MSBs stored in the memory cells MC1 may form an MSB page.

That is, a bit stored in each of memory cells in a row may form a single page. Memory cells in one row may form a multi-page including a plurality of single pages. The multi-page may indicate all single pages programmed at memory cells in a row.

Figure 7:
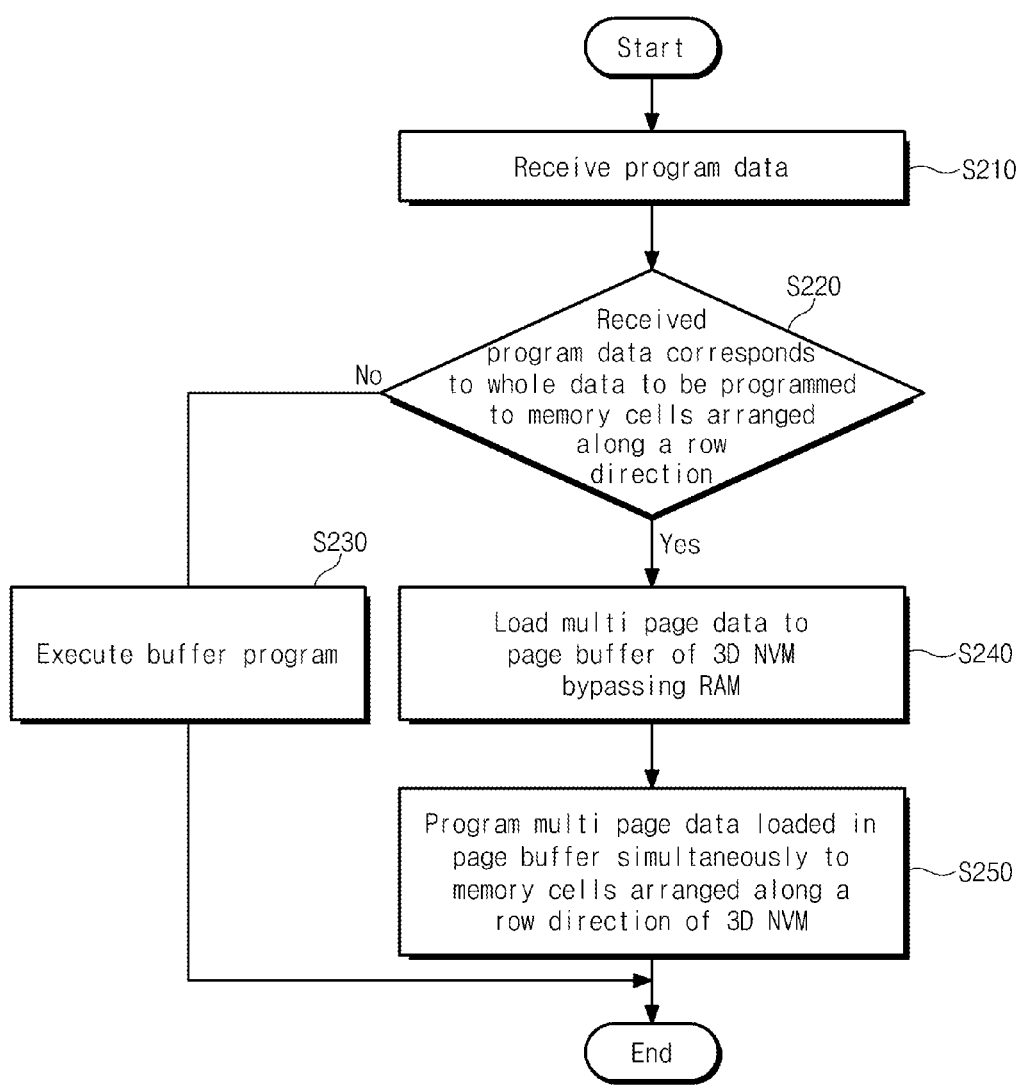
FIG. 7 is a flow chart summarizing a program method according to an embodiment of the inventive concept.

FIG. 7 is a flow chart summarizing a program method according to an embodiment of the inventive concept. Referring to FIGS. 1, 3, and 7, program data is received (S210). For example, program data may be provided to a controller 1300 from an external device EX.

A determination is next made as to whether the received program data corresponds to the whole data to be programmed to the memory cells arranged along a row direction (S220). In this context, the term "whole data" is used to denote all of the data to be programmed to the memory cells. Thus, when one memory cell is configured to store N bits, whole data will include all of the N bits to be programmed to the memory cell. In the assumed working example, whole data includes LSBs, CSBs, and MSBs to be programmed to the respective memory cells.

The controller 1300 may determine the nature of the program data based on a corresponding address (e.g., a logical address) as provided by an external device. In certain embodiments, the controller 1300 may convert the input address into a physical address and determine the nature of the program data based on the derived physical address.

If the program data is not whole data (S220=No), a buffer programming operation is performed (S230). The buffer programming may be executed using the random access memory 1200 of FIG. 1. The buffer programming operation will be described in additional detail with reference to several embodiments that follow.

If the program data is whole data (S220=Yes), the whole data (i.e., multi-page data) is loaded to the page buffer 1130 of the three-dimensional nonvolatile memory 1100 without passing through the random access memory 1200 (S240). The controller 1300 may then transfer the multi-page data to the three-dimensional nonvolatile memory 1100, and the three-dimensional nonvolatile memory 1100 may load the multi-page data to the page buffer 1130.

The multi-page data loaded to the page buffer 1130 may then be simultaneously programmed to the memory cells arranged along a row direction of the three-dimensional nonvolatile memory 1100 (S250). The three-dimensional nonvolatile memory 1100 may simultaneously program the loaded multi-page data at the memory cells arranged along a row direction.

Figure 8:
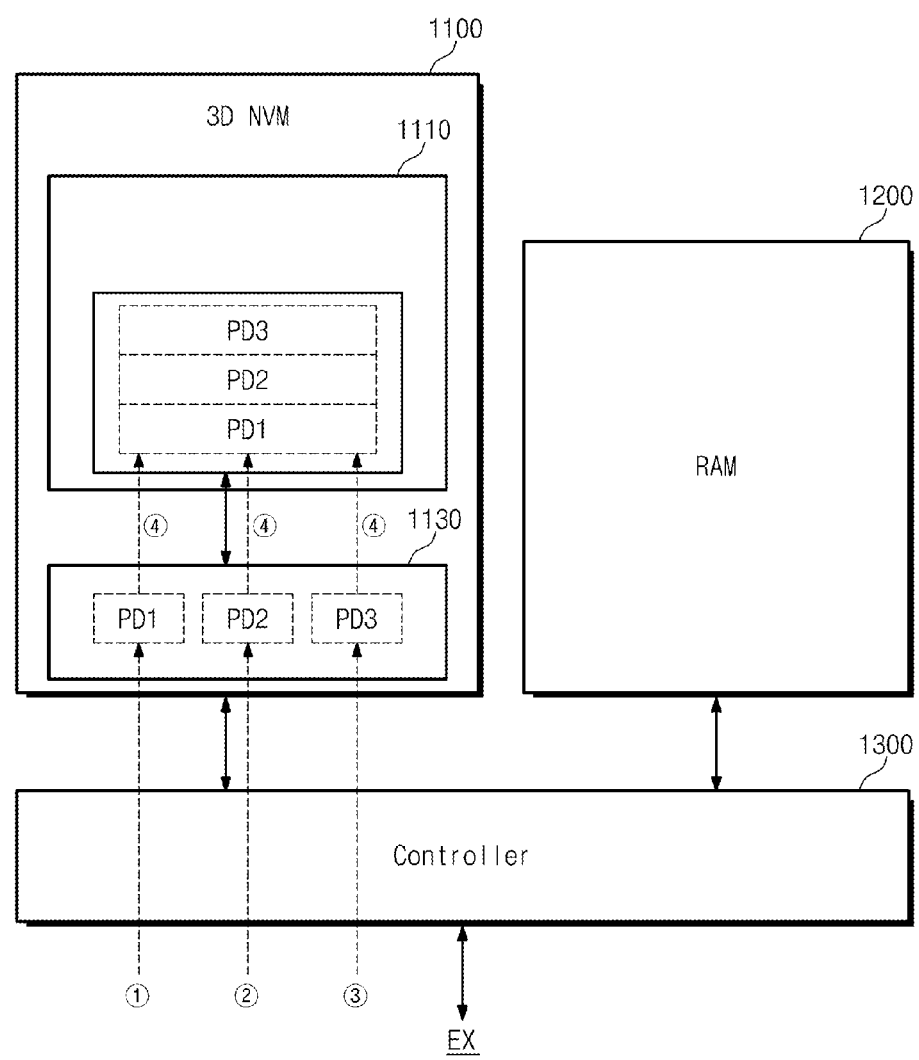
FIG. 8 is a diagram further illustrating the memory system of FIG. 1 as controlled to execute a program operation according to the method of FIG. 7.

FIG. 8 is a diagram illustrating an example in which a memory system in FIG. 1 executes a program operation according to the program method in FIG. 7. Referring to FIGS. 7 and 8, program data PD1, PD2, and PD3 may be sequentially received from an external device (EX). The program data PD1, PD2, and PD3 may correspond to multi-page data. For example, LSB data PD1, CSB data PD2, and MSB data PD3 may be sequentially received. There may be received the whole data to be programmed at memory cells arranged along a row direction.

The LSB data PD1, CSB data PD2 and MSB data PD3 may be directly loaded to the page buffer 1130 of the three-dimensional nonvolatile memory 1100 without passing through the random access memory 1200. The LSB data PD1, CSB data PD2 and MSB data PD3 directly loaded to the page buffer 1130 may be simultaneously programmed at memory cells arranged along a row direction.

Figure 9:
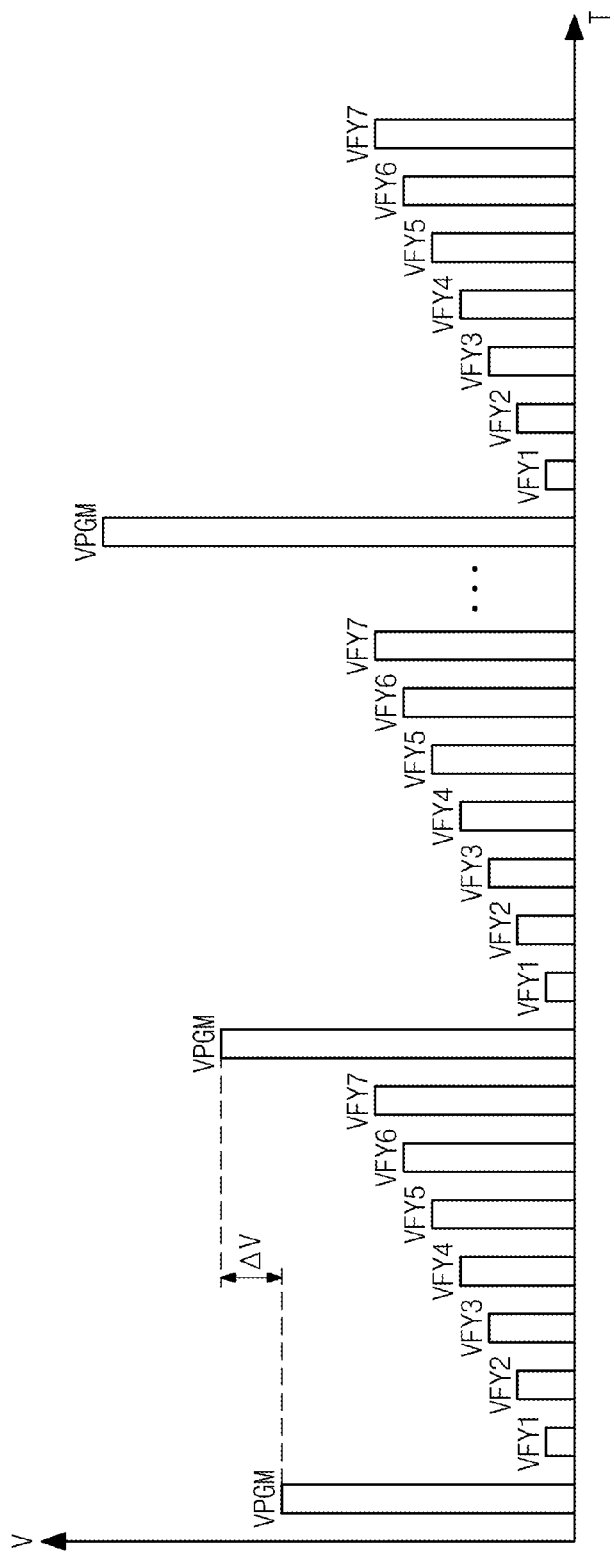
FIG. 9 is a diagram illustrating voltages applied during a program operation of a three-dimensional nonvolatile memory.

FIG. 9 is a diagram illustrating voltages that may be applied during a program operation of a three-dimensional nonvolatile memory. In FIG. 9, a horizontal axis may indicate a time T, and a vertical axis may indicate a voltage V. Referring to FIGS. 4 and 9, a program voltage VPGM may be applied to a selected one of word lines WL1 to WL6. After the program voltage VPGM is applied, verify voltages VFY1 to VFY7 may be sequentially applied to the selected word line. The verify voltages VFY1 to VFY7 may be voltages to program multi-page data at the same time. The verify voltages VFY1 to VFY7 may be voltages used to determine whether threshold voltages of memory cells reach target levels.

If program failed memory cells exist after sequential applying of the verify voltages VFY1 to VFY7, the program voltage VPGM may be again applied to the selected word line. In this case, a level of the program voltage VPGM may increase by an increment ΔV. Afterwards, the verify voltages VFY1 to VFY7 may be sequentially applied to the selected word line.

The program voltage VPGM and the verify voltages VFY1 to VFY7 may be iteratively applied until memory cells are program passed. Likewise, a level of the program voltage VPGM may increase by an increment ΔV whenever the program voltage VPGM is iteratively applied. That is, Incremental Step Pulse Programming may be performed.

Figure 10:
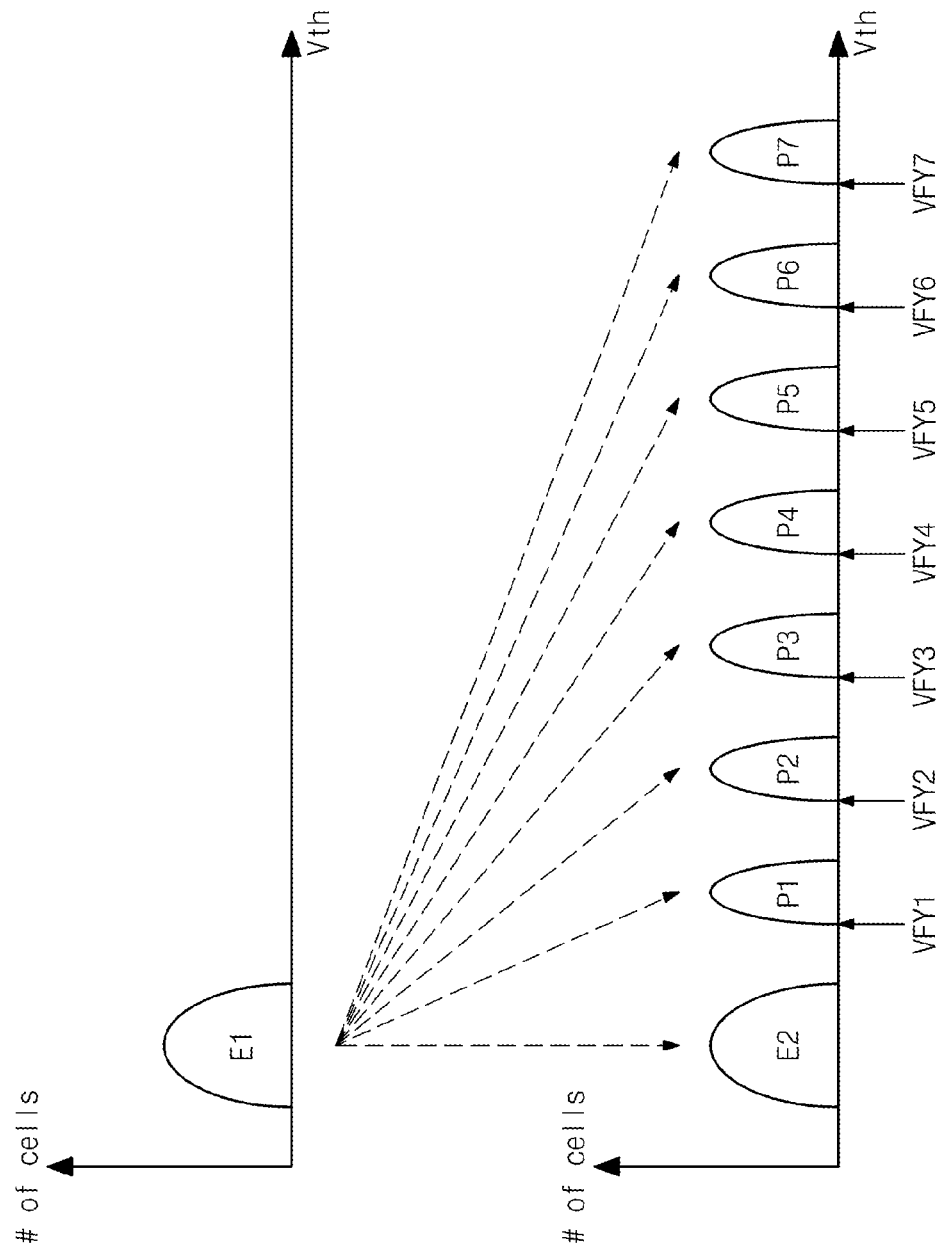
FIG. 10 is a diagram illustrating the programming effect of voltages applied during a program operation of a three-dimensional nonvolatile memory.

FIG. 10 is a diagram illustrating variations of memory cell threshold voltages as programmed according to method illustrated in FIG. 9. In FIG. 10, a horizontal axis may indicate a threshold voltage, and a vertical axis may indicate the number of memory cells. That is, FIG. 10 shows a variation in threshold voltage distributions of memory cells MC.

Referring to FIGS. 9 and 10, memory cells having an erase state E1 may be programmed to an erase state E2 and program states P1 to P7, respectively.

Memory cells programmed to the erase state E2 (or, not programmed) may be program inhibited. Memory cells programmed to the program state P1 may be program inhibited after their threshold voltages reach a verify voltage VFY1. Memory cells programmed to the program state P2 may be program inhibited after their threshold voltages reach a verify voltage VFY2. Memory cells programmed to the program state P3 may be program inhibited after their threshold voltages reach a verify voltage VFY3. Memory cells programmed to the program state P4 may be program inhibited after their threshold voltages reach a verify voltage VFY4. Memory cells programmed to the program state P5 may be program inhibited after their threshold voltages reach a verify voltage VFY5. Memory cells programmed to the program state P6 may be program inhibited after their threshold voltages reach a verify voltage VFY6. Memory cells programmed to the program state P7 may be program inhibited after their threshold voltages reach a verify voltage VFY7.

Coupling may arise when memory cells are programmed from the erase state E1 to the program states P1 to P7. To prevent threshold voltages of adjacent memory cells from being unintentionally varied by such coupling, certain conventional NAND flash memory may sequentially program LSB, CSB, and MSB data. In such cases, since variation of a threshold voltage generated by once programming may be reduced, the coupling effects may be reduced. Accordingly, variation in threshold voltages of adjacent memory cells may be reduced.

As illustrated in FIG. 4, memory cells at a same height in a memory block BLKa may be commonly connected to a word line. That is, a word line is shared. In this case, when a program operation is performed with respect to a first row of cell strings CS11 and CS12, a second row of cell strings CS21 and CS22 may experience a stress by a program voltage and a pass voltage. Assuming the structure of FIG. 4, if LSB, and then CSB, and then MSB are sequentially programmed, a number of program (NOP) operations experienced by the target memory cells will exponentially increase, as compared with similar programming circumstances in a planar NAND flash memory.

Within the context of embodiments of the inventive concept, LSB, CSB, and MSB data may be programmed at the same time using the "once programming" approach. Therefore, the number of program operations applied to the memory cells may be reduced. As a result, memory cell fatigue is reduced and the reliability of a memory system 1000 improved.

As illustrated in FIG. 5, information storage films 116 may be surrounded by conductive materials CM2 to CM7 that are used as word lines WL1 to WL6 and as control gates of memory cells MC1 to MC6. The conductive materials CM2 to CM7 may act as electromagnetic shields. Although threshold voltages of memory cells vary, the conductive materials CM2 to CM7 acting as electromagnetic shields may block influence of the coupling. Thus, as illustrated in FIG. 9, although threshold voltages of memory cells sharply vary, threshold voltages of adjacent memory cells may not vary.

That is, as illustrated in FIG. 5, as the conductive materials CM2 to CM7 are used as electromagnetic shields surrounding the information storage films 116 of the memory cells MC1 to MC6, LSB, CSB, and MSB may be simultaneously programmed without causing a threshold voltage variation due to the coupling. In a structure of a memory block BLKa illustrated in FIGS. 4 and 5, as LSB, CSB, and MSB are simultaneously programmed, the number of program (NOP) operations applied to the memory cells may be reduced. The memory system 1000 of FIG. 1 having improved reliability may achieved by storing program data using the random access memory 1200 as a buffer, and programming the three-dimensional nonvolatile memory 1100 may be performed according to a multi-page unit.

Figure 11:
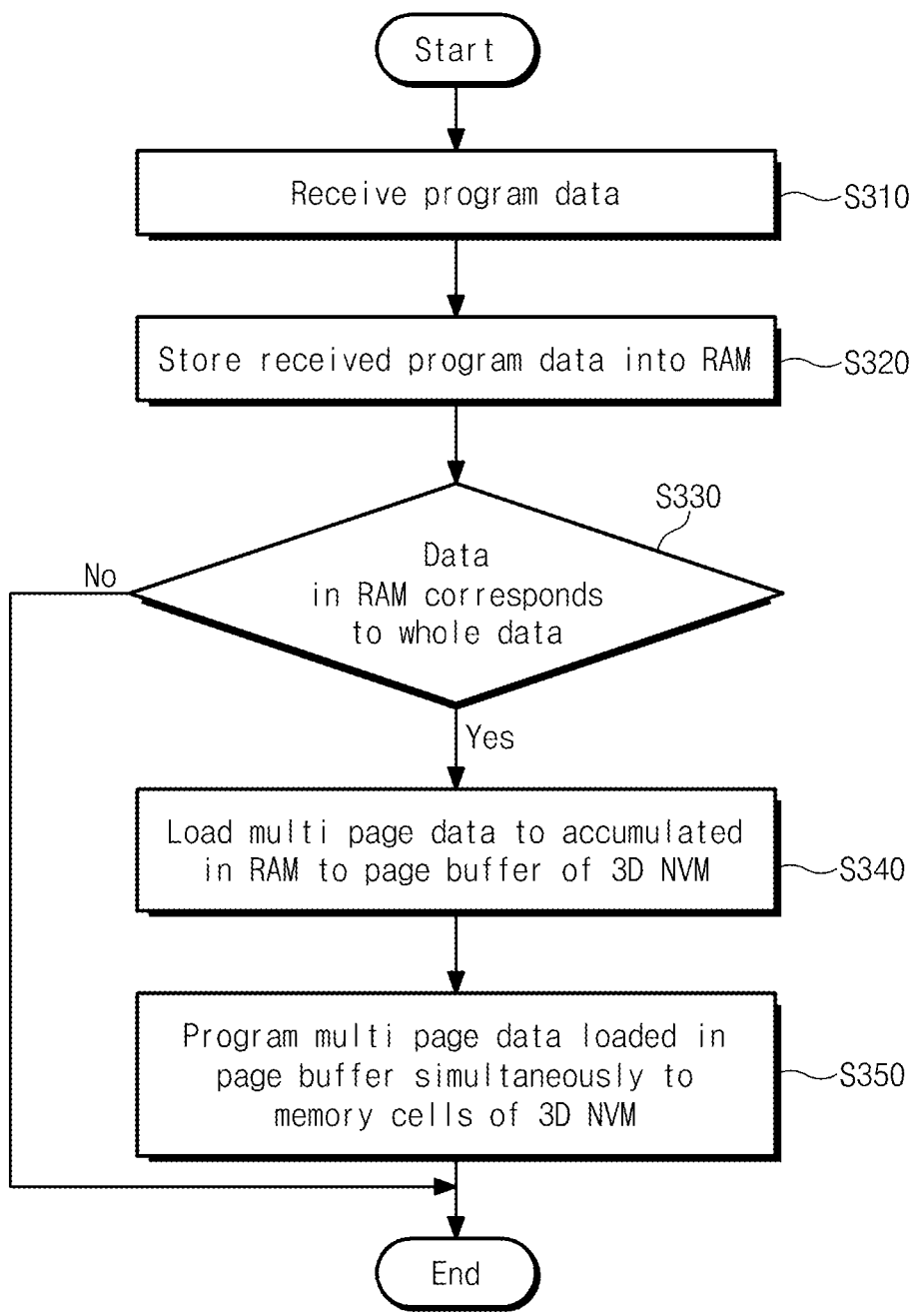
FIG. 11 is a flow chart summarizing a programming approach using a random access memory as a buffer within the system of FIG. 1.

FIG. 11 is a flow chart summarizing a buffer programming method using the random access memory 1200 of FIG. 1 that may be applied to certain embodiments of the inventive concept. Referring collectively to FIGS. 1, 3, and 11, program data is received (S310). The size of the received program data may be less than a defined whole data size, per the foregoing discussion. The program data may be provided to the controller 1300 from an external device EX.

The program data is now stored in the random access memory 1200 (S320). The controller 1300 may be used to store the program data in the random access memory 1200.

A determination is now made as to whether data accumulated in the random access memory 1200 is whole data (i.e., all of the data to be programmed to memory cells arranged along a row direction) (S330). For example, when one memory cell stores N bits, the determination is made as to whether all of the N bits to be programmed to each of memory cell arranged along a row direction have been received. The controller 1300 may be used to determine whether data accumulated in the random access memory 1200 corresponds to whole data.

If data accumulated in the random access memory 1200 is whole data (i.e., multi-page data) (S330=Yes), the multi-page data accumulated at the random access memory 1200 is then loaded to the page buffer 1130 of the three-dimensional nonvolatile memory 1100 (S340). Then, the multi-page data loaded to the page buffer 1130 may be simultaneously programmed to the memory cells of the three-dimensional nonvolatile memory 1100 (S350).

In the described embodiments, after the multi-page data accumulated in the random access memory 1200 is programmed to memory cells of the three-dimensional nonvolatile memory 1100, it may be routinely deleted from the random access memory 1100.

Figure 12:
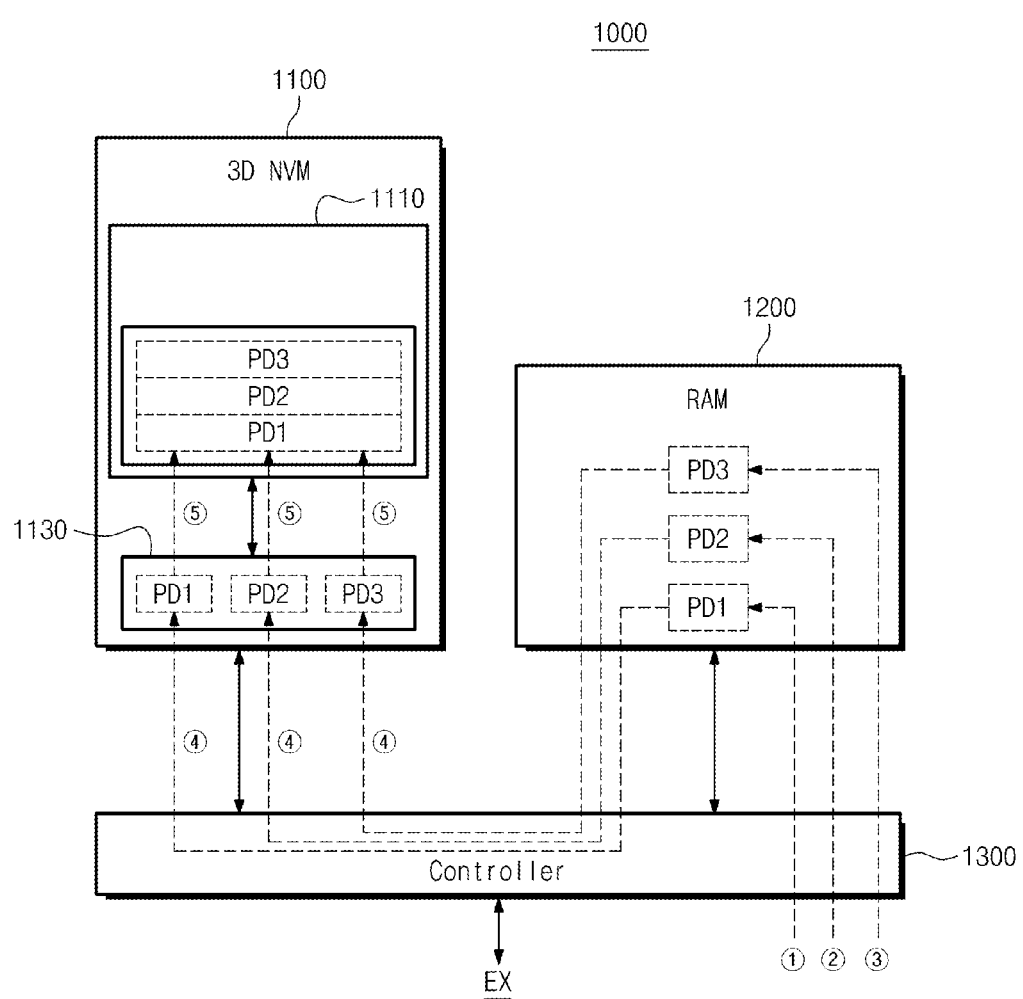
FIGS. 12 and 13 are diagrams further illustrating embodiments in which the memory system of FIG. 1 performs a program operation according to the program method of FIG. 11.

FIG. 12 is a diagram further illustrating an embodiment in which the memory system of FIG. 1 performs a program operation according to the program method of FIG. 11. Referring to FIGS. 11 and 12, the controller 1300 may be used to store program data PD1, PD2, and PD3 received from an external device EX in the random access memory 1200. The size of the received program data PD1, PD2, and PD3 may be less than that of "whole" multi-page data. However, in certain embodiments the program data PD1, PD2, and PD3 may correspond to LSB data, CSB data, and MSB data to be programmed to memory cells of the three-dimensional nonvolatile memory 1100 arranged along a row direction, respectively. The LSB, CSB, and MSB data PD1, PD2, and PD3 may be received independently and need not be received at the same time.

The controller 1300 may be used to store the LSB, CSB, and MSB data PD1, PD2, and PD3, as independently received, in the random access memory 1200. Thus, the controller 1300 may be used to store data received from the external device EX in the random access memory 1200 such that all of the data accumulated in the random access memory 1200 comes to constitute a defined set of multi-page data.

If the MSB data PD3 is stored in the random access memory 1200, the data PD1, PD2, and PD3 accumulated at the random access memory 1200 may correspond to multi-page data. If the data PD1, PD2, and PD3 accumulated at the random access memory 1200 correspond to multi-page data, the controller 1300 may transfer the data PD1, PD2, and PD3 accumulated at the random access memory 1200 to the three-dimensional nonvolatile memory 1100.

The data PD1, PD2, and PD3 transferred to the three-dimensional nonvolatile memory 1100 may be loaded to the page buffer 1300. Afterwards, the three-dimensional nonvolatile memory 1100 may program the loaded data PD1, PD2, and PD3 at the same time at memory cells in a row.

In FIG. 12, there is described an example in which data received from the external device EX is single-page data. However, data received from the external device EX need not be limited to single-page data. If data stored in the random access memory 1200 corresponds to multi-page data, the controller 1300 may program data accumulated at the random access memory 1200 at the three-dimensional nonvolatile memory 1100 regardless of the size of data received from the external device EX.

Figure 13:
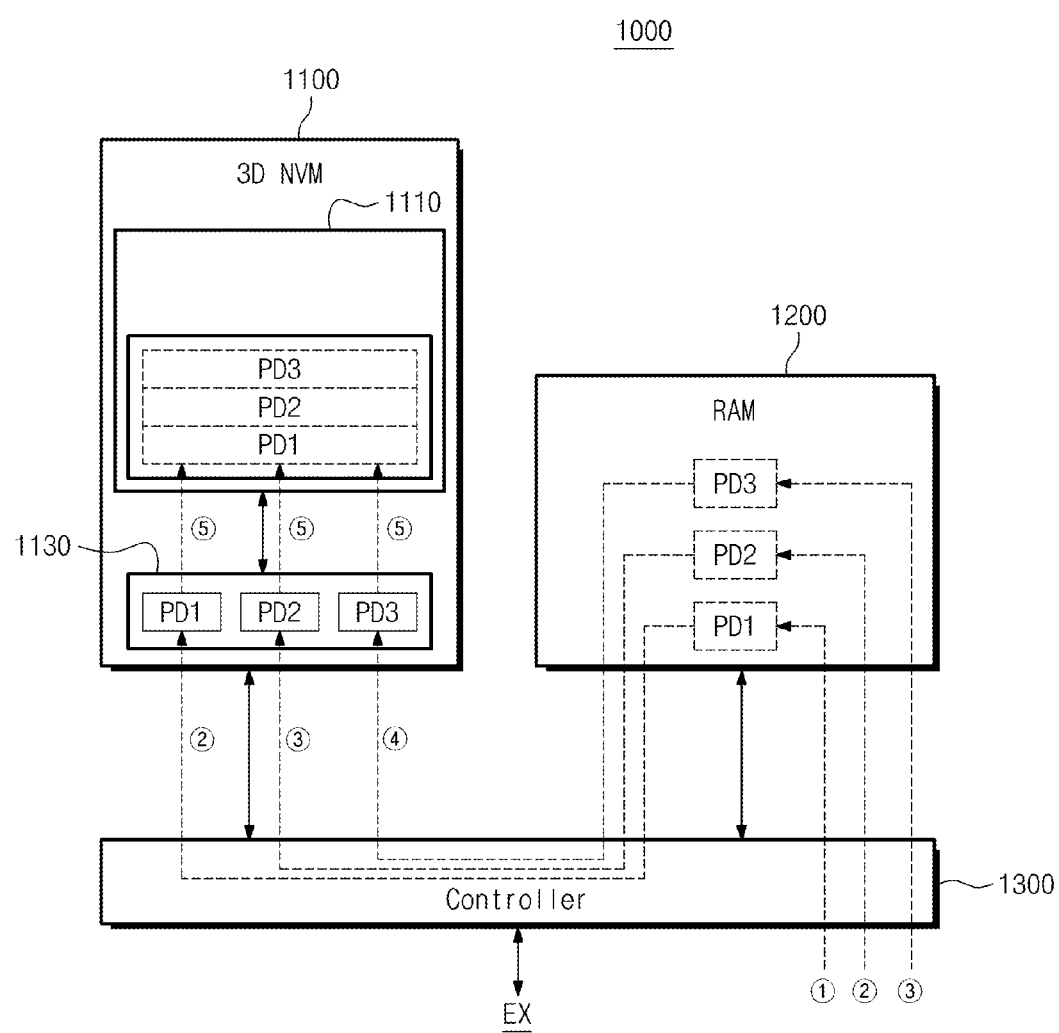

FIG. 13 is a diagram illustrating another embodiment in which a memory system of FIG. 1 performs a program operation according to the program method of FIG. 11. Referring to FIGS. 11 and 13, LSB data PD1 may be stored in the random access memory 1200. While CSB data PD2 is stored in the random access memory 1200, the LSB data PD1 stored in the random access memory 1200 may be loaded to the page buffer 1130 of the three-dimensional nonvolatile memory 1100. While MSB data PD3 is stored in the random access memory 1200, the CSB data PD2 stored in the random access memory 1200 may be loaded to the page buffer 1130 of the three-dimensional nonvolatile memory 1100. The MSB data PD3 stored in the random access memory 1200 may be loaded to the page buffer 1130 of the three-dimensional nonvolatile memory 1100. Afterwards, the LSB, CSB, and MSB data PD1, PD2, and PD3 loaded onto the page buffer 1130 may be simultaneously programmed to memory cells (e.g., memory cells arranged along a row direction of a memory cell array 1110) of the three-dimensional nonvolatile memory 1100.

While page data is stored in the random access memory 1200, page data that was stored in the random access memory 1200 may be loaded to the page buffer 1130 of the three-dimensional nonvolatile memory 1100. In certain embodiments, the period of time during which page data PD1, PD2, and PD3 are stored in the random access memory 1200, and a period of time during which page data are loaded to the page buffer 1130 of the three-dimensional nonvolatile memory 1100 from the random access memory 1200 may overlap. That is, it is possible to reduce the total time required to load data to the page buffer 1130 of the three-dimensional nonvolatile memory 1100.

Figure 14:
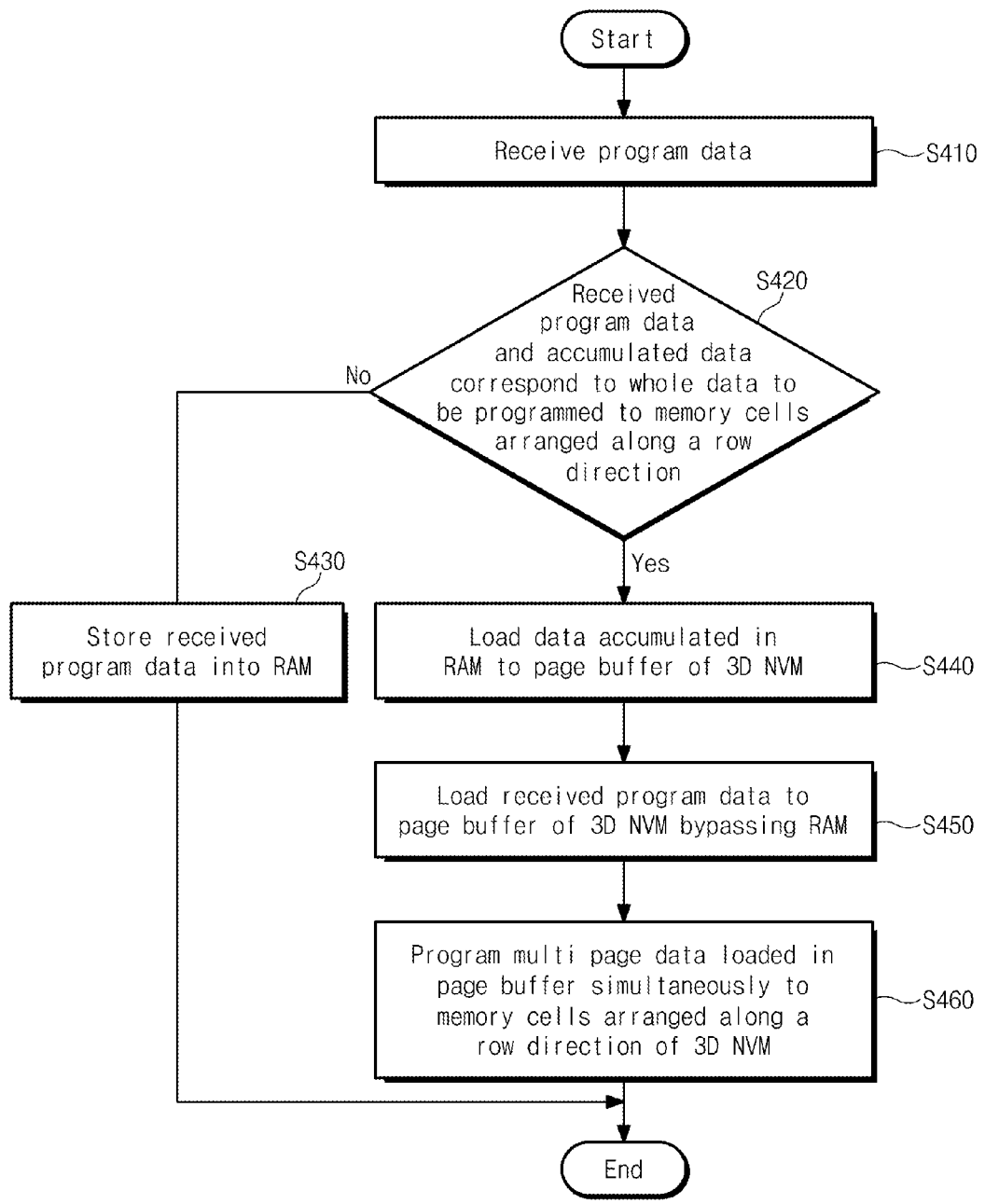
FIG. 14 is a flow chart summarizing another buffer programming method using the random access memory of FIG. 1 according to an embodiment of the inventive concept.

FIG. 14 is a flow chart summarizing another embodiment in which a buffer programming method using the random access memory in FIG. 1 is used in relation to a three-dimensional nonvolatile memory. Referring collectively to FIGS. 1, 3, and 14, program data is received (S410). The size of the received program data may be less than or equal to a size corresponding to whole data. Here, it is again assumed that "whole data" is data to be programmed to a set of memory cells arranged along a row direction. As before, the program data may be provided to the controller 1300 from an external device EX.

A determination is made as to whether the received program data together with data accumulated in the random access memory 1200 are whole data (i.e., whether the received program data and the data accumulated in the random access memory 120 correspond to a defined set of multi-page data) (S420). Here, it is assumed that one memory cell is configured to store N bits. Thus, when (N−1) bits to be programmed to each of memory cells arranged along a row direction are accumulated in the random access memory 1200 and an Nth bit is received a positive determination of whole data (S420=Yes) may be made. Again, the controller 1300 may be used to determine whether whole data is apparent, including data accumulated in the random access memory 1200 and program data received from the external device EX.

If the data accumulated in the random access memory 1200 and the program data received from the external device EX do not correspond to whole data (i.e., said data does not correspond to the defined multi-page data) (S420=No), then the program data is merely stored in the random access memory 1200 (S430). The controller 1300 may be used to store program data in the random access memory 1200.

However, if the data accumulated in the random access memory 1200 and the program data received from the external device EX correspond to multi-page data (S420=Yes), the data accumulated in the random access memory 1200 may be loaded to the page buffer 1130 of the three-dimensional nonvolatile memory 1100 (S440). And, the received program data may be loaded to the page buffer 1130 of the three-dimensional nonvolatile memory 1100 (S450). The controller 1300 may be used to transfer data accumulated in the random access memory 1200 as well as the received program data to the three-dimensional nonvolatile memory 1100. In this manner, multi-page data may be loaded to the page buffer 1130.

Then, the multi-page data loaded to the page buffer 1130 may be simultaneously programmed to memory cells of the memory cell array 1110 of the three-dimensional nonvolatile memory 1100 arranged along a row direction (S460).

Figure 15:
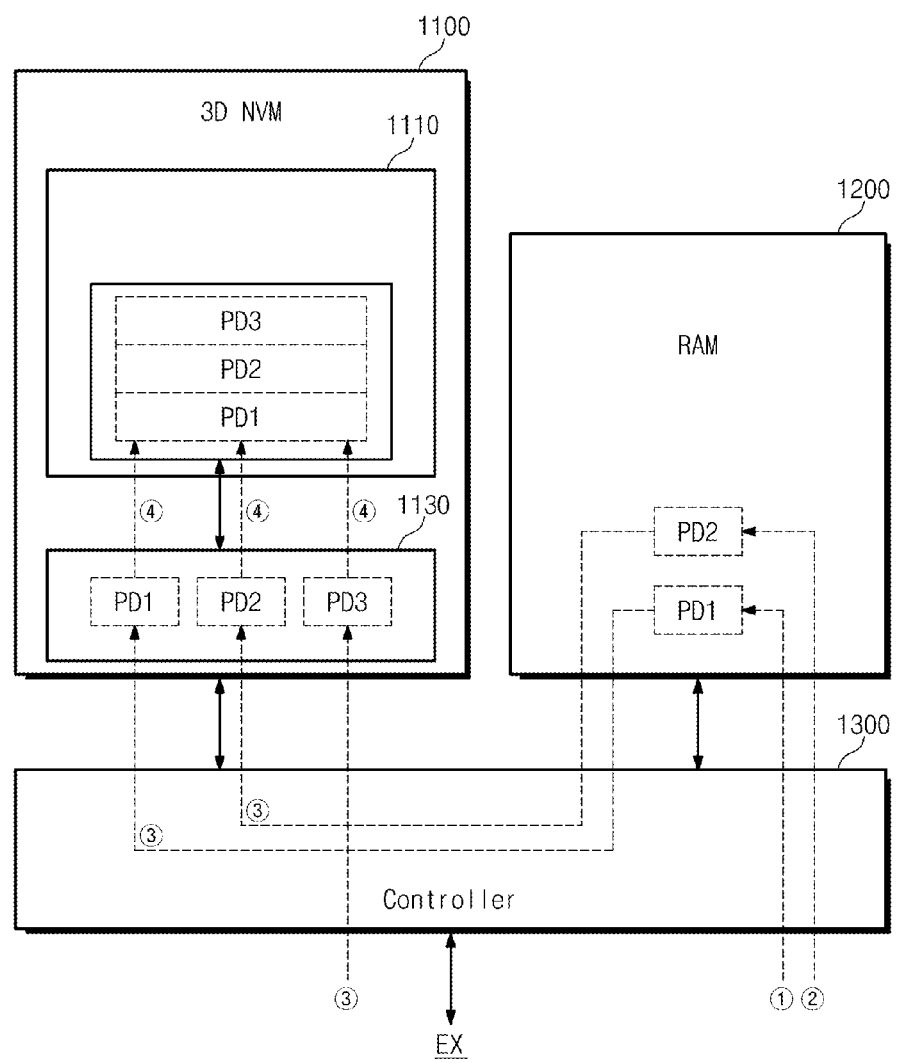
FIGS. 15 and 16 are diagrams further illustrating embodiments in which the memory system of FIG. 1 performs a program operation according to the program method of FIG. 14.

FIG. 15 is a diagram illustrating an embodiment in which the memory system of FIG. 1 performs a program operation according to the program method of FIG. 14. Referring to FIGS. 14 and 15, LSB page data PD1 and CSB page data PD2 may be provided to a controller 1300 from an external device EX together or independently. The LSB page data PD1 and CSB page data PD2 may be provided to the controller 1300 independently from the external device EX.

When LSB page data PD1 is received, the input data and data accumulated at a random access memory 1200 may not correspond to multi-page data. Thus, the controller 1300 may store the LSB page data PD1 at the random access memory 1200.

When CSB page data PD2 is received, the input data and data accumulated at the random access memory 1200 may not correspond to multi-page data. Thus, the controller 1300 may store the CSB page data PD2 at the random access memory 1200.

When MSB page data PD3 is received, the input data and data accumulated at the random access memory 1200 may correspond to multi-page data. Thus, the controller 1300 may transfer the LSB and CSB page data PD1 and PD2 accumulated at the random access memory 1200 to a three-dimensional nonvolatile memory 1110. Also, the controller 1300 may transfer the MSB page data PD3 input from the external device EX directly to the three-dimensional nonvolatile memory 1100 without passing through the random access memory 1200.

The three-dimensional nonvolatile memory 1300 may load the input multi-page data PD1, PD2, and PD3 onto a page buffer 1130. The multi-page data PD1, PD2, and PD3 loaded onto the page buffer 1130 may be simultaneously programmed at memory cells of a memory cell array 1110 arranged along a row direction.

Figure 16:
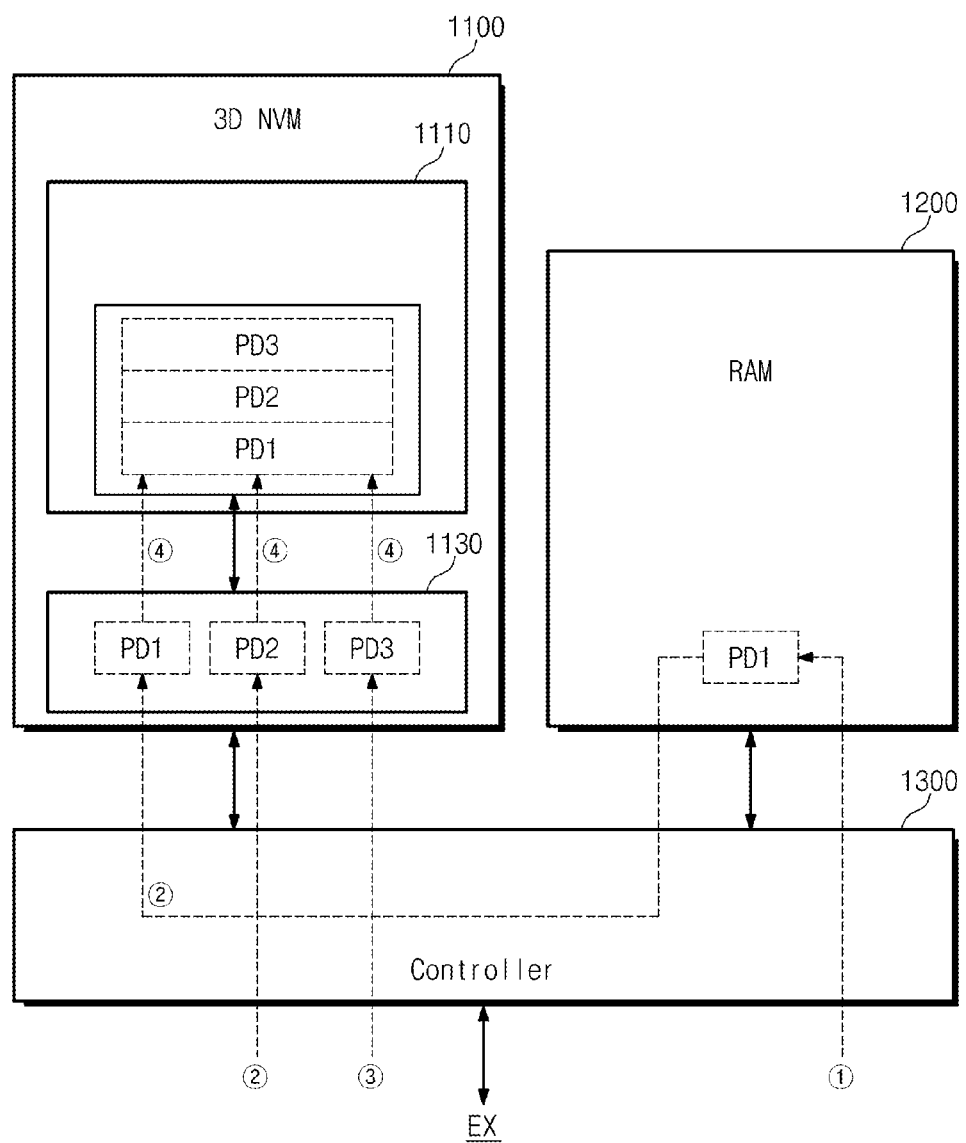

FIG. 16 is a diagram illustrating another embodiment in which the memory system of FIG. 1 performs a program operation according to the program method in FIG. 14. Referring to FIGS. 14 and 16, LSB page data PD1 and CSB page data PD2 may be provided to a controller 1300 from an external device EX independently. CSB page data PD2 and MSB page data PD3 may be provided to the controller 1300 from the external device together.

When the LSB page data PD1 is received, the input data and data accumulated at a random access memory 1200 may not correspond to multi-page data. Thus, the controller 1300 may store the LSB page data PD1 at the random access memory 1200.

When the CSB page data PD2 and the MSB page data PD3 are received, the input data and data accumulated at the random access memory 1200 may correspond to multi-page data. Thus, the controller 1300 may transfer the LSB page data PD1 accumulated at the random access memory 1200 to a three-dimensional nonvolatile memory 1110. The controller 1300 may transfer the CSB page data PD2 and the MSB page data PD3 input from the external device EX directly to the three-dimensional nonvolatile memory 1100 without passing through the random access memory 1200.

The three-dimensional nonvolatile memory 1300 may load the input multi-page data PD1, PD2, and PD3 onto a page buffer 1130. The multi-page data PD1, PD2, and PD3 loaded onto the page buffer 1130 may be simultaneously programmed at memory cells of a memory cell array 1110 arranged along a row direction.

Consistent with the embodiments described with reference to FIG. 14, FIG. 15, and FIG. 16, the random access memory 1200 may be configured to store a portion of whole data (e.g., a portion of defined multi-page data). Thus, it is possible to reduce the storage capacity (or size) of the random access memory 1200 that must be provisioned to the memory system 1000 of FIG. 1.

Figure 17:
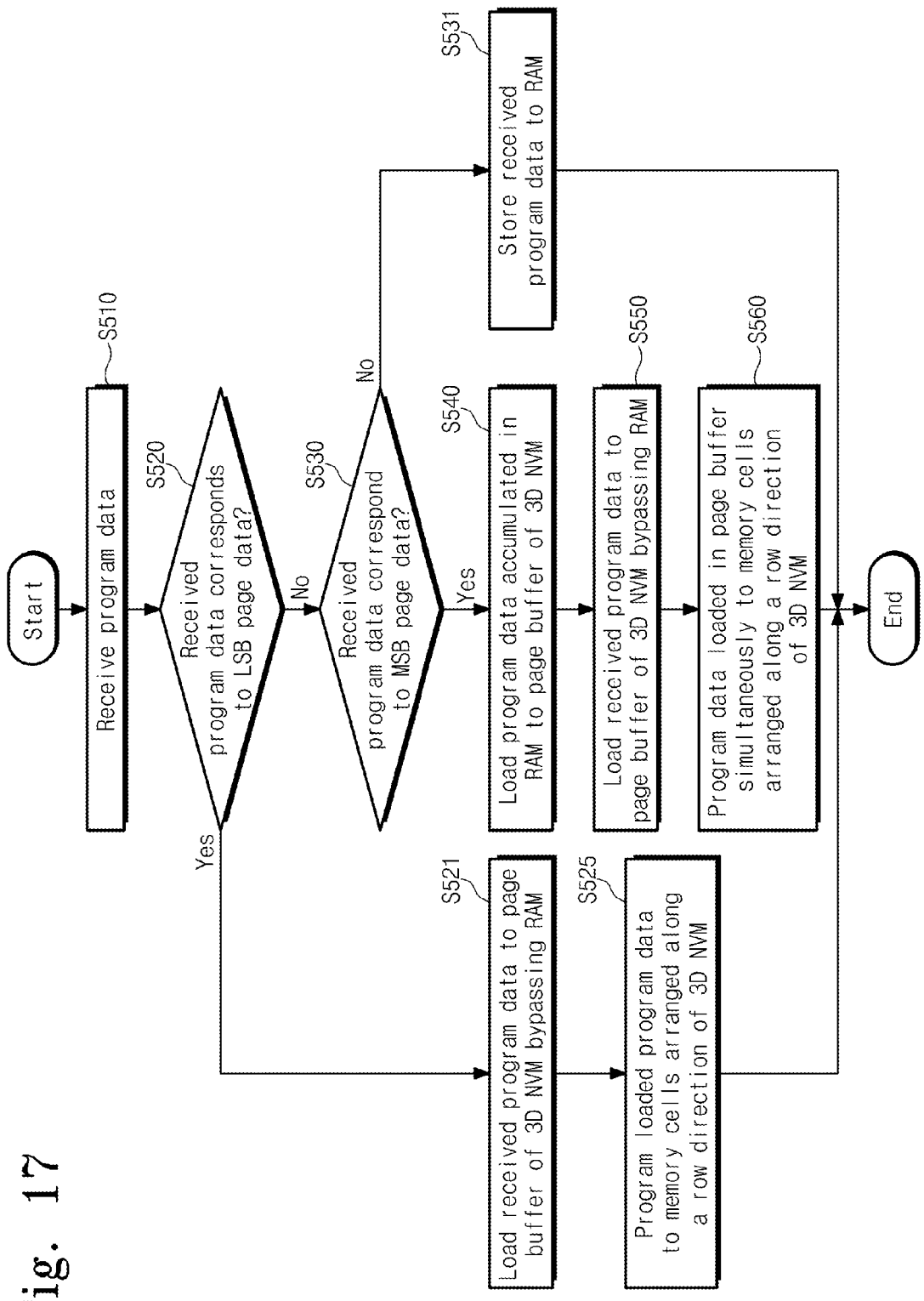
FIG. 17 is a flow chart summarizing still another buffer programming method using the random access memory of FIG. 1 according to an embodiment of the inventive concept.

FIG. 17 is a flow chart illustrating still another embodiment of a buffer programming method using the random access memory of FIG. 1. Referring collectively to FIGS. 1, 3, and 17, program data is received (S510). As before, the size of the received program data may be less than or equal to whole data to be programmed at memory cells arranged along a row direction.

At least one determination is then made as to whether the received program data corresponds to a particular portion of defined multi-page data. In the illustrated example of FIG. 17, for example, a determination may be made as to whether received data corresponds to LSB page data (S520), and then a determination may be made as to whether received data corresponds to MSB page data (S530).

If the received program data corresponds to LSB page data (S520=Yes), the program data may be loaded directly to the page buffer 1130 of the three-dimensional nonvolatile memory 1100 without passing through the random access memory 1200 (S521). Then, the LSB page data loaded to the page buffer 1130 may be programmed to memory cells arranged along a row direction (S525).

If the received program data does not correspond to LSB page data (S520=No), then the determination is made as to whether received data corresponds to MSB page data (S530). If the received program data does not correspond to MSB page data (S530=No), that is, if the input program data corresponds to CSB page data, then the CSB page data is stored in the random access memory 1200 (S531).

However, if the received program data corresponds to MSB page data (S530=Yes), the data accumulated in the random access memory 1200 may be directly loaded to the page buffer 1130 of the three-dimensional nonvolatile memory 1300 (S540) and the received program data may be loaded to the page buffer 1130 of the three-dimensional nonvolatile memory 1300 (S550). Thus, the controller 1300 may be used to transfer the CSB page data accumulated at the random access memory 1200 and the MSB page data received from the external device EX to the three-dimensional nonvolatile memory 1300. The three-dimensional nonvolatile memory 1300 may load the CSB and MSB page data to the page buffer 1130.

Then, the CSB and MSB page data loaded onto the page buffer 130 may be programmed to the memory cells arranged along a row direction at the same time (S560).

Figure 18:
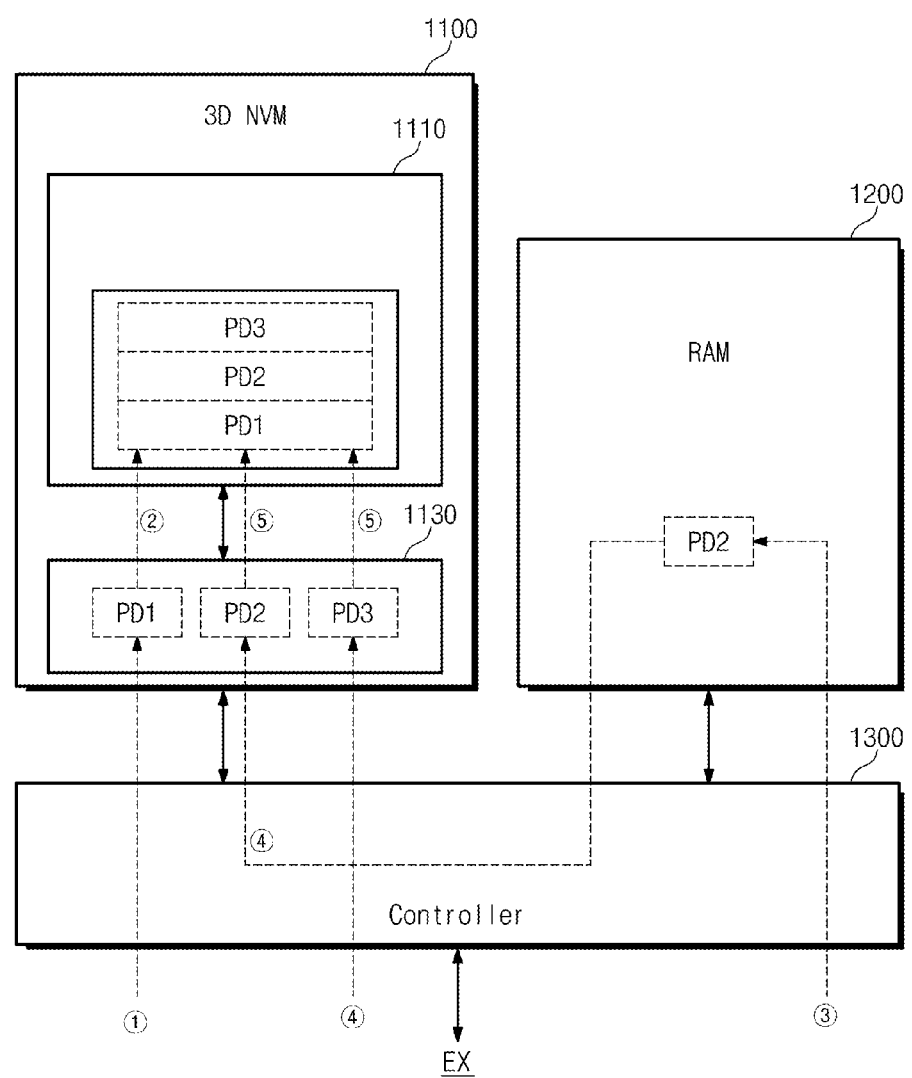
FIG. 18 is a diagram further illustrating embodiments in which the memory system of FIG. 1 performs a program operation according to the program method of FIG. 17.

FIG. 18 is a diagram illustrating an example in which the memory system of FIG. 1 performs a program operation according to the program method of FIG. 17. Referring to FIGS. 17 and 18, LSB page data PD1, CSB page data PD2, and MSB page data PD3 may be provided to a controller 1300 from an external device EX independently.

When the LSB page data PD1 is received, the controller 1300 may load the input LSB page data PD1 directly to the page buffer 1130 of the three-dimensional nonvolatile memory 1300 without passing through the random access memory 1200. The LSB page data PD1 loaded onto the page buffer 1130 may be programmed at memory cells arranged along a row direction.

When CSB page data PD2 is received, the controller 1300 may store the input CSB page data PD2 at the random access memory 1200.

When MSB page data PD3 is received, the controller 1300 may transfer the CSB page data PD2 accumulated at the random access memory 1200 to the three-dimensional nonvolatile memory 1100. Also, the controller 1300 may transfer the MSB page data PD3 provided from the external device EX directly to the three-dimensional nonvolatile memory 1100 without passing through the random access memory 1200. The three-dimensional nonvolatile memory 1100 may load the CSB and MSB page data onto the page buffer 1130. The CSB and MSB page data PD2 and PD3 loaded onto the page buffer 1130 may be simultaneously programmed at the memory cells of the memory cell array 1110 arranged along a row direction.

In the illustrated embodiments, single-page data of multi-page data may be stored in the random access memory 1200. Thus, it is possible to reduce a storage capacity (or, a size) of the random access memory 1200.

In the illustrated embodiments, program data may be a portion of single-page data and need not be entire single-page data. In such cases, the controller 1300 may be used to store a received portion of the single-page data until whole single-page data has been received.

For example, when a first portion of LSB data is received, the controller 1300 may be used to store the partial LSB data in the random access memory 1200. Afterwards, when received program data and data accumulated in the random access memory 1200 correspond to LSB page data, the controller 1300 may transfer the program data and the data accumulated in the random access memory 1200 to the three-dimensional nonvolatile memory 1100. The received program data may be transferred directly to the three-dimensional nonvolatile memory 1100 without passing through the random access memory 1200. Receipt of the CSB page data and MSB page data may be similarly managed.

Figure 19:
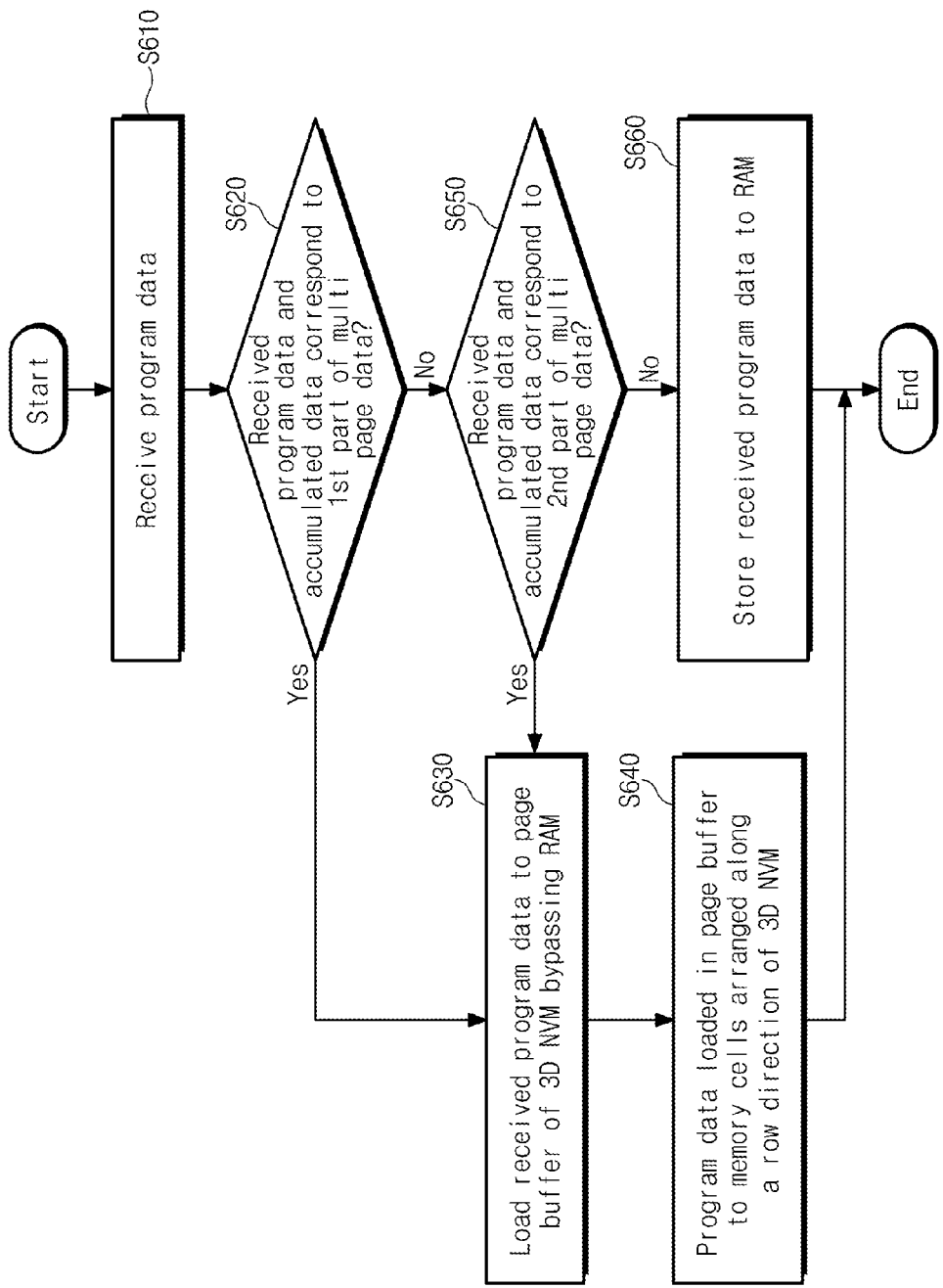
FIG. 19 is a flow chart summarizing still another buffer programming method using the random access memory of FIG. 1 according to an embodiment of the inventive concept.

FIG. 19 is a flow chart summarizing still another embodiment of buffer programming using the random access memory of FIG. 1. Referring collectively to FIGS. 1, 3, and 19, program data is received (S610). As before, the size of the received program data may be less than or equal to whole data to be programmed at memory cells arranged along a row direction.

A determination is made as to whether the received program data together with data accumulated in the random access memory 1200 ("collective data") correspond to a first portion of multi-page data (S620). The controller 1300 may be used to determine whether the collective program data corresponds to a first portion of multi-page data. For example, the controller 1300 may determine whether the collective program data corresponds to LSB page data or whether the collective program data corresponds to LSB page data and CSB page data.

If the collective program data correspond to the first portion of the multi-page data (S620=Yes), it is loaded to the page buffer 1130 of the three-dimensional nonvolatile memory 1100 (S630). In the illustrated embodiment of FIG. 19, the collective program data may be loaded to the page buffer 1130 without passing through the random access memory 1200. Then, the collective data loaded to the page buffer 1130 may be programmed to memory cells in the memory cell array 1110 arranged along a row direction (S640).

However, if the collective program data does not correspond to the first portion of the multi-page data (S620=No), than a determination is made as to whether the collective program data corresponds to a second portion of the multi-page data may be determined (S650). Again the controller 1300 may be used to determine whether the collective program data corresponds to CSB page data or MSB page data.

If the collective program data corresponds to the second portion of the multi-page data (S650=Yes), then using operations S630 and S640 previously described, the second portion of the multi-page data may be programmed to the memory cells of the three-dimensional nonvolatile memory 1100 at the same time.

However, if the collective program data does not correspond to the second portion of the multi-page data (S650=No), then the collective program data may be stored in the random access memory 1200 (S660).

Figure 20:
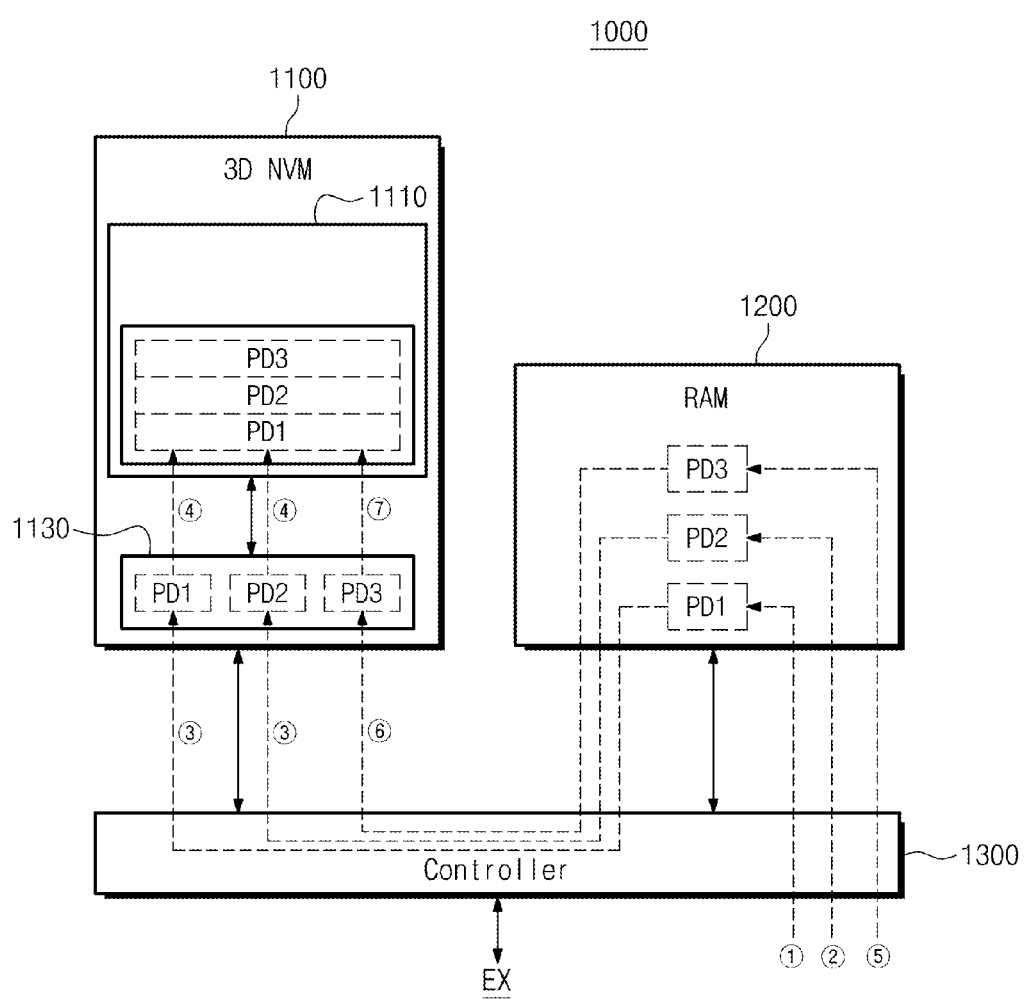
FIGS. 20 and 21 are diagrams further illustrating embodiments in which the memory system of FIG. 1 performs a program operation according to the program method of FIG. 19.

FIG. 20 is a diagram illustrating an example in which the memory system of FIG. 1 performs a program operation according to the program method of FIG. 19. Referring to FIGS. 19 and 20, a first portion of multi-page data may be LSB page data PD1 and CSB page data PD2, and a second portion thereof may be MSB page data PD3.

LSB page data PD1 and CSB page data PD2 may be sequentially stored in the random access memory 1200. The LSB page data PD1 and the CSB page data PD2 stored in the random access memory 1200 may be loaded to the page buffer 1130 of the three-dimensional nonvolatile memory 1300 to be programmed at memory cells of a memory cell array 1110 arranged along a row direction at the same time.

Afterwards, MSB page data PD3 may be stored in the random access memory 1200. The MSB page data PD3 stored to the random access memory 1200 may be loaded to the page buffer 1130 of the three-dimensional nonvolatile memory 1300 to be programmed at memory cells of the memory cell array 1110 arranged along a row direction at the same time. The MSB page data PD3 may be programmed at the same memory cells as those at which the LSB and CSB page data PD1 and PD2 are programmed.

Figure 21:
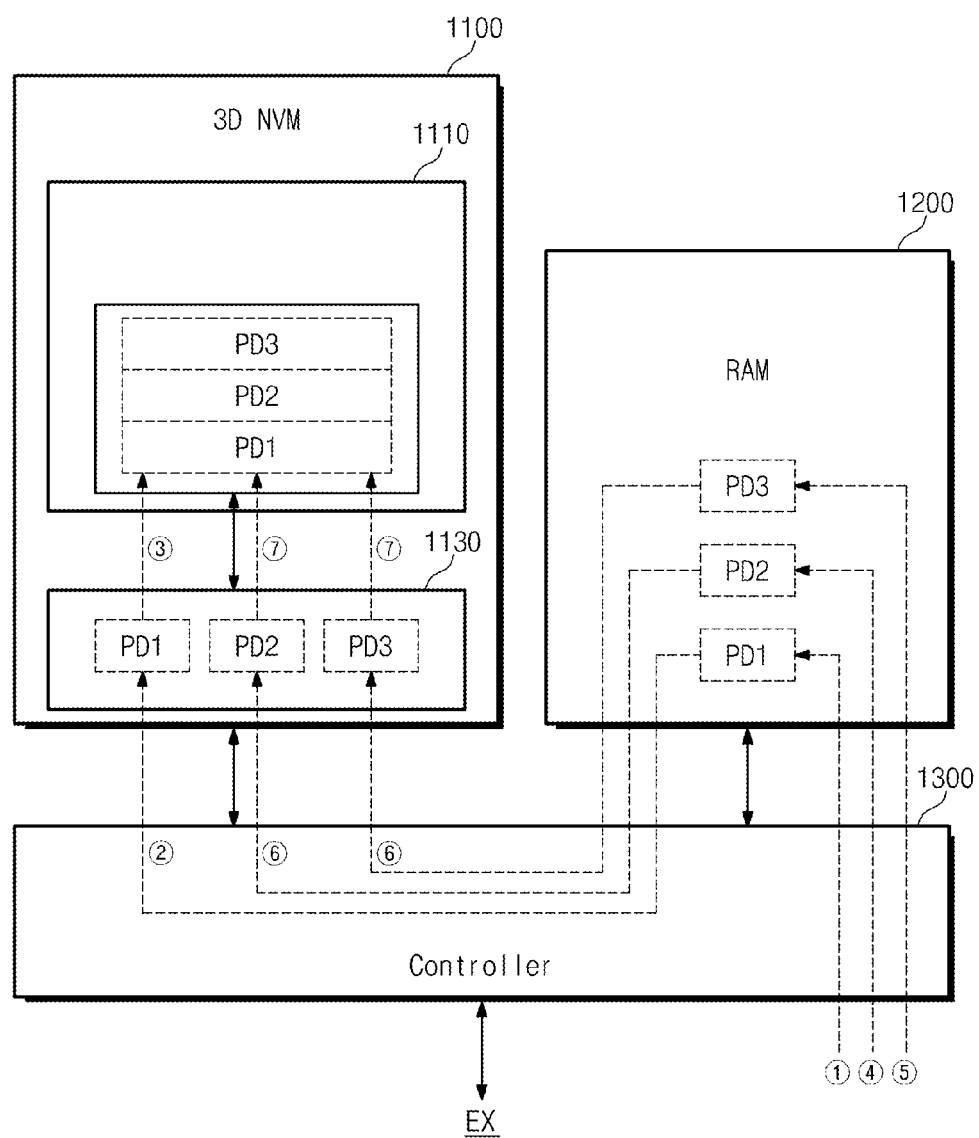

FIG. 21 is a diagram illustrating another example in which the memory system of FIG. 1 performs a program operation according to the program method of FIG. 19. Referring to FIGS. 19 and 21, a first portion of multi-page data may be LSB page data PD1, and a second portion thereof may be CSB page data PD2 and MSB page data PD3.

LSB page data PD1 may be stored in the random access memory 1200. The LSB page data PD1 stored in the random access memory 1200 may be loaded to the page buffer 1130 of the three-dimensional nonvolatile memory 1300 to be programmed at memory cells of a memory cell array 1110 arranged along a row direction.

Afterwards, CSB page data PD2 and MSB page data PD3 may be stored in the random access memory 1200. The CSB page data PD2 and the MSB page data PD3 stored in the random access memory 1200 may be loaded to the page buffer 1130 of the three-dimensional nonvolatile memory 1300 to be programmed at memory cells of the memory cell array 1110 arranged along a row direction at the same time. The CSB page data PD2 and MSB page data PD3 may be programmed at the same memory cells as those at which the LSB page data PD1 is programmed.

When one memory cell stores N-bit data, that is, when one multi-page includes N separate data pages, each single page of the constituent multi-page may be divided and programmed. For example, single pages of a first portion of a multi-page may be programmed at memory cells arranged along a row direction at the same time, and single pages of a second portion of the multi-page may be further programmed at the memory cells arranged along a row direction at the same time.

According to the foregoing illustrated embodiments, the storage capacity (or size) of the random access memory 1200 may be reduced. That is, a trade-off between the number of program operations which memory cells of a three-dimensional nonvolatile memory 1100 experience and the storage capacity of the random access memory 1200 may be evaluated and performed.

Figure 22:
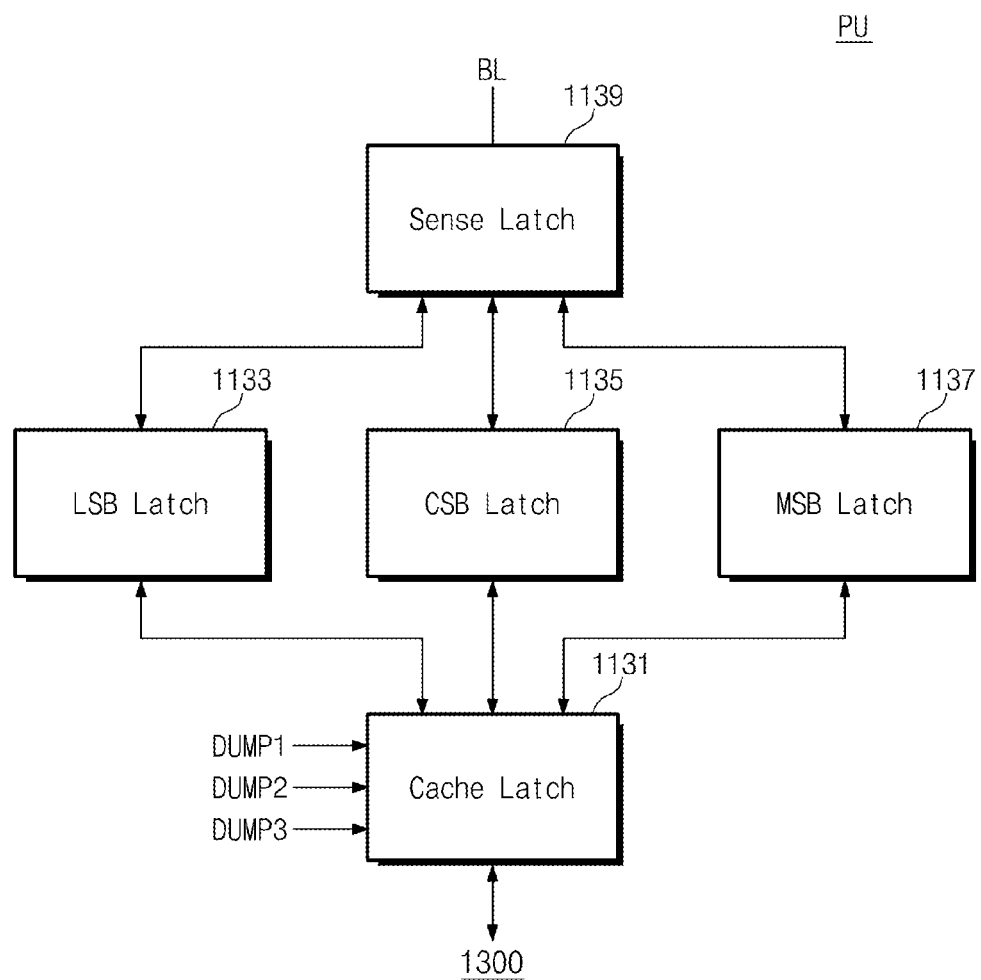
FIG. 22 is a block diagram further illustrating one of page buffer units of FIG. 3.

FIG. 22 is a block diagram illustrating one of the page buffer units of FIG. 3. Referring to FIG. 22, a page buffer unit PU may include a cache latch 1131, an LSB latch 1133, a CSB latch 1135, an MSB latch 1137, and a sense latch 1139.

The cache latch 1131 may exchange data with a controller 1300. The cache latch 1131 may operate responsive to dump signals DUMP1, DUMP2, and DUMP3 provided from control logic 1140.

During programming, the cache latch 1131 may receive data from a controller 1300. When the dump signal DUMP1 is activated, the cache latch 1131 may transfer stored data to the LSB latch 1133. When the dump signal DUMP2 is activated, the cache latch 1131 may transfer stored data to the CSB latch 1135. When the dump signal DUMP3 is activated, the cache latch 1131 may transfer stored data to the MSB latch 1137. For example, LSB page data may be loaded onto the LSB latch 1133, CSB page data may be loaded onto the CSB latch 1135, and MSB page data may be loaded onto the MSB latch 1137.

The sense latch 1139 may be connected to a bit line BL. During programming, the sense latch 1139 may bias the bit line BL according to data stored in the LSB, CSB, and MSB latches 1133, 1135, and 1137. During program verifying, the sense latch 1139 may sense a voltage of the bit line BL. For example, the sense latch 1139 may adjust a sensing result according to data stored in the LSB, CSB, and MSB latches 1133, 1135, and 1137.

Figure 23:
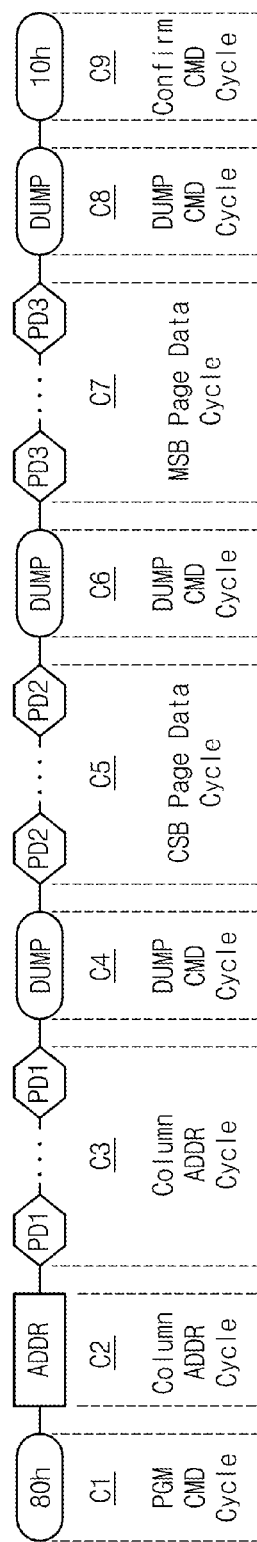

FIG. 23 is a timing diagram illustrating an example of signals that may be transferred to a three-dimensional nonvolatile memory from a controller during programming. Referring collectively to FIGS. 1, 22, and 23, during a first cycle C1, a controller 1300 may transfer a program command 80h to a three-dimensional nonvolatile memory 1100.

During a second cycle C2, the controller 1300 may send an address ADDR to the three-dimensional nonvolatile memory 1300. The address ADDR may appoint memory cells of the three-dimensional nonvolatile memory 1100 arranged along a row direction.

During a third cycle C3, the controller 1300 may provide LSB page data PD1 to the three-dimensional nonvolatile memory 1100. The LSB page data PD1 may be data provided from an external device EX or data stored in the random access memory 1200. The three-dimensional nonvolatile memory 1100 may store the input LSB page data PD1 at a cache latch 1131.

During a fourth cycle C4, the controller 1300 may transfer a dump command DUMP to the three-dimensional nonvolatile memory 1100. The dump command DUMP may include information indicating that transferred data is LSB page data PD1. The dump command DUMP may be transferred together with an address indicating that transferred data is LSB page data PD1. In response to the dump command CMD, the three-dimensional nonvolatile memory 1100 may load the LSB page data PD1 stored in the cache latch 1131 onto an LSB latch 1133.

During a fifth cycle C5, the controller 1300 may send CSB page data PD2 to the three-dimensional nonvolatile memory 1100. The CSB page data PD2 may be data received from the external device EX or data transferred from the random access memory 1200. The three-dimensional nonvolatile memory 1100 may store the input CSB page data PD2 at the cache latch 1131.

During a sixth cycle C6, the controller 1300 may transfer a dump command DUMP to the three-dimensional nonvolatile memory 1100. The dump command DUMP may include information indicating that transferred data is CSB page data PD2. The dump command DUMP may be transferred together with an address indicating that transferred data is CSB page data PD2. In response to the dump command CMD, the three-dimensional nonvolatile memory 1100 may load the CSB page data PD2 stored in the cache latch 1131 onto a CSB latch 1135.

During a seventh cycle C7, the controller 1300 may send MSB page data PD3 to the three-dimensional nonvolatile memory 1100. The MSB page data PD3 may be data received from the external device EX or data transferred from the random access memory 1200. The three-dimensional nonvolatile memory 1100 may store the input MSB page data PD2 at the cache latch 1131.

During an eighth cycle C8, the controller 1300 may transfer a dump command DUMP to the three-dimensional nonvolatile memory 1100. The dump command DUMP may include information indicating that transferred data is MSB page data PD3. The dump command DUMP may be transferred together with an address indicating that transferred data is MSB page data PD3. In response to the dump command CMD, the three-dimensional nonvolatile memory 1100 may load the MSB page data PD3 stored in the cache latch 1131 onto an MSB latch 1137.

During a ninth cycle C9, the controller 1300 may send a confirm command 10h to the three-dimensional nonvolatile memory 1100. In response to the confirm command 10h, the three-dimensional nonvolatile memory 1100 may program the LSB page data PD1, the CSB page data PD2, and the MSB page data PD3 respectively stored in the LSB latch 1133, the CSB latch 1135, and the MSB latch 1137 at memory cells arranged along a row direction at the same time.

FIG. 24 is a table listing a program addressing scheme for a three-dimensional nonvolatile memory as defined by the program sequence of FIG. 23. Referring to FIG. 24, an address may be assigned to memory cells arranged along a row direction. That is, LSB page data PD1, CSB page data PD2, and MSB page data PD3 to be programmed to memory cells arranged along a row direction may be programmed according to the same address. However, during a read operation, however, LSB page data PD1, CSB page data PD2, and MSB page data PD3 programmed to memory cells arranged along a row direction must be read according to different addresses. Thus, an address scheme must be used during programming that is different from the address scheme used during reading.

A program sequence and corresponding addressing scheme can be understood with reference to FIGS. 23 and 24 and may be applied to embodiments in which LSB page data PD1, CSB page data PD2, and MSB page data PD3 are simultaneously programmed.

Figure 25:
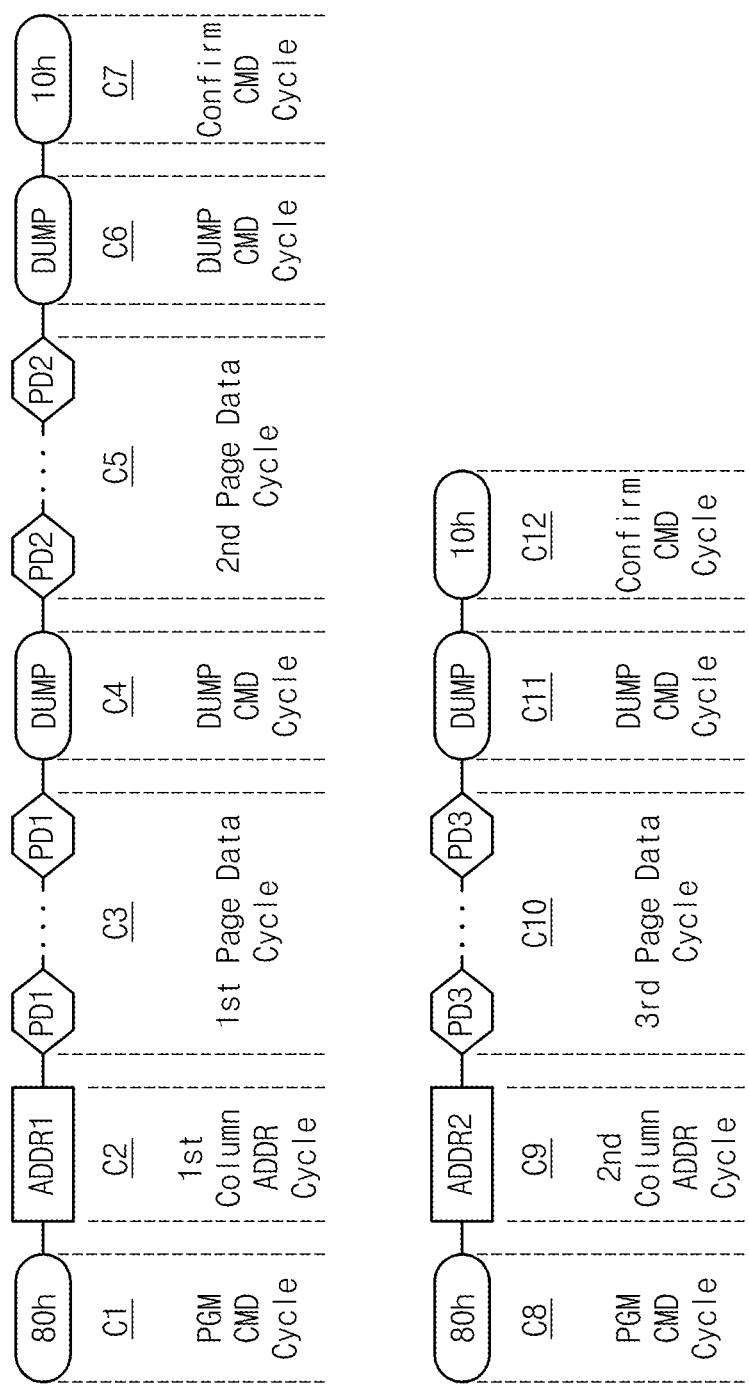

FIG. 25 is a timing diagram illustrating another example of signals that may be transferred to a three-dimensional nonvolatile memory from a controller during programming. Referring collectively to FIGS. 1, 22, and 25, during a first cycle C1, a controller 1300 may transfer a program command 80h to a three-dimensional nonvolatile memory 1100.

During a second cycle C2, the controller 1300 may send a first address ADDR1 to the three-dimensional nonvolatile memory 1300. The first address ADDR1 may appoint LSB page data and CSB page data of memory cells of the three-dimensional nonvolatile memory 1100 arranged along a row direction.

During a third cycle C3, the controller 1300 may provide LSB page data PD1 to the three-dimensional nonvolatile memory 1100. The three-dimensional nonvolatile memory 1100 may store the input LSB page data PD1 at a cache latch 1131.

During a fourth cycle C4, the controller 1300 may transfer a dump command DUMP to the three-dimensional nonvolatile memory 1100. In response to the dump command CMD, the three-dimensional nonvolatile memory 1100 may load the LSB page data PD1 stored in the cache latch 1131 onto an LSB latch 1133.

During a fifth cycle C5, the controller 1300 may send CSB page data PD2 to the three-dimensional nonvolatile memory 1100. The three-dimensional nonvolatile memory 1100 may store the input CSB page data PD2 at the cache latch 1131.

During a sixth cycle C6, the controller 1300 may transfer a dump command DUMP to the three-dimensional nonvolatile memory 1100. In response to the dump command CMD, the three-dimensional nonvolatile memory 1100 may load the CSB page data PD2 stored in the cache latch 1131 onto a CSB latch 1135.

During a seventh cycle C7, the controller 1300 may send a confirm command 10h to the three-dimensional nonvolatile memory 1100. In response to the confirm command 10h, the three-dimensional nonvolatile memory 1100 may program the LSB page data PD1 and the CSB page data PD2 at memory cells arranged along a row direction at the same time.

During an eighth cycle C8, the controller 1300 may transfer a program command 80h to the three-dimensional nonvolatile memory 1100. In example embodiments, the controller 1300 and the three-dimensional nonvolatile memory 1100 can perform a variety of operations between the cycles C7 and C8. Under the control of the controller 1300, the three-dimensional nonvolatile memory 1100 may perform an initial read operation in which LSB page data PD1 and CSB page data PD2 are read from memory cells arranged along a row direction and the read LSB page data PD1 and CSB page data PD2 are stored in an LSB latch 1133 and a CSB latch 1135, respectively.

During a ninth cycle C9, the controller 1300 may send a second address ADDR2 to the three-dimensional nonvolatile memory 1300. The second address ADDR1 may appoint MSB page data of memory cells of the three-dimensional nonvolatile memory 1100 arranged along a row direction.

During a tenth cycle C10, the controller 1300 may provide MSB page data PD3 to the three-dimensional nonvolatile memory 1100. The three-dimensional nonvolatile memory 1100 may store the input MSB page data PD3 at the cache latch 1131.

During an eleventh cycle C11, the controller 1300 may transfer a dump command DUMP to the three-dimensional nonvolatile memory 1100. In response to the dump command CMD, the three-dimensional nonvolatile memory 1100 may load the MSB page data PD2 stored in the cache latch 1131 onto an MSB latch 1137.

During a twelfth cycle C12, the controller 1300 may send a confirm command 10h to the three-dimensional nonvolatile memory 1100. In response to the confirm command 10h, the three-dimensional nonvolatile memory 1100 may further program the MSB page data PD3 at memory cells at which the LSB page data PD1 and the CSB page data PD2 are programmed.

FIG. 26 is a table listing another program addressing scheme for a three-dimensional nonvolatile memory corresponding to the program sequence of FIG. 25. Referring to FIG. 26, two addresses may be assigned to memory cells arranged along a row direction. That is, LSB page data PD1 and CSB page data PD2 to be programmed at memory cells arranged along a row direction may be programmed according to one address, and MSB page data PD3 may be programmed according to the other address.

The program sequence and addressing scheme described with reference to FIGS. 25 and 26 may be applied to embodiments in which LSB page data PD1 and CSB page data PD2 are simultaneously programmed and MSB page data PD3 is further programmed.

Figure 27:
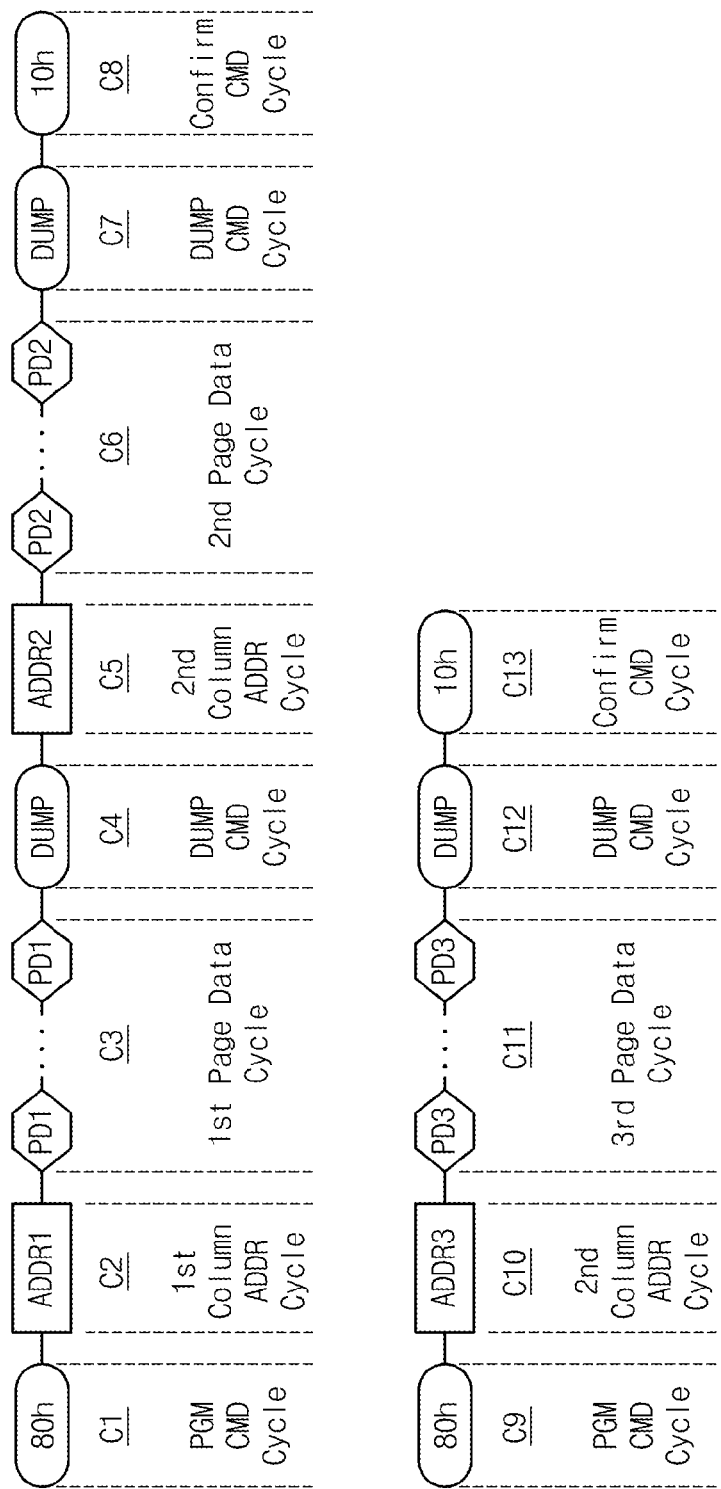

FIG. 27 is a timing diagram illustrating still another example of signals that may be transferred to a three-dimensional nonvolatile memory from a controller during programming Referring collectively to FIGS. 1, 22, and 27, during a first cycle C1, a controller 1300 may transfer a program command 80h to a three-dimensional nonvolatile memory 1100.

During a second cycle C2, the controller 1300 may send a first address ADDR1 to the three-dimensional nonvolatile memory 1300. The first address ADDR1 may appoint LSB page.

During a third cycle C3, the controller 1300 may provide LSB page data PD1 to the three-dimensional nonvolatile memory 1100. The three-dimensional nonvolatile memory 1100 may store the input LSB page data PD1 at a cache latch 1131.

During a fourth cycle C4, the controller 1300 may transfer a dump command DUMP to the three-dimensional nonvolatile memory 1100. In response to the dump command CMD, the three-dimensional nonvolatile memory 1100 may load the LSB page data PD1 stored in the cache latch 1131 onto an LSB latch 1133.

During a fifth cycle C5, the controller 1300 may send a second address ADDR2 to the three-dimensional nonvolatile memory 1300. The second address ADDR2 may appoint CSB page.

During a sixth cycle C6, the controller 1300 may provide CSB page data PD2 to the three-dimensional nonvolatile memory 1100. The three-dimensional nonvolatile memory 1100 may store the input CSB page data PD2 at a cache latch 1131.

During a seventh cycle C7, the controller 1300 may transfer a dump command DUMP to the three-dimensional nonvolatile memory 1100. In response to the dump command CMD, the three-dimensional nonvolatile memory 1100 may load the CSB page data PD2 stored in the cache latch 1131 onto a CSB latch 1135.

During an eighth cycle C8, the controller 1300 may send a confirm command 10*h* to the three-dimensional nonvolatile memory 1100. In response to the confirm command 10*h*, the three-dimensional nonvolatile memory 1100 may program the LSB page data PD1 and the CSB page data PD2 at memory cells arranged along a row direction at the same time.

During a ninth cycle C9, the controller 1300 may send a program command 80*h* to the three-dimensional nonvolatile memory 1100. Before the program command 80*h* is sent, an initial read operation may be executed.

During a tenth cycle C10, the controller 1300 may send a third address ADDR3 to the three-dimensional nonvolatile memory 1300. The third address ADDR3 may appoint MSB page.

During an eleventh cycle C11, the controller 1300 may provide MSB page data PD3 to the three-dimensional nonvolatile memory 1100. The three-dimensional nonvolatile memory 1100 may store the input MSB page data PD32 at a cache latch 1131.

During a twelfth cycle C12, the controller 1300 may transfer a dump command DUMP to the three-dimensional nonvolatile memory 1100. In response to the dump command CMD, the three-dimensional nonvolatile memory 1100 may load the MSB page data PD3 stored in the cache latch 1131 onto an MSB latch 1137.

During a thirteenth cycle C13, the controller 1300 may send a confirm command 10*h* to the three-dimensional nonvolatile memory 1100. In response to the confirm command 10*h*, the three-dimensional nonvolatile memory 1100 may further program the MSB page data PD3.

FIG. 28 is a table listing a program addressing scheme for a three-dimensional nonvolatile memory corresponding the program sequence of FIG. 27. Referring to FIG. 28, three addresses may be assigned to memory cells arranged along a row direction. That is, LSB page data PD1, CSB page data PD2, and MSB page data PD3 to be programmed at memory cells arranged along a row direction may be programmed according to different addresses.

The program sequence and addressing scheme described with reference to FIGS. 27 and 28 may be applied to embodiments in which LSB page data PD1 and CSB page data PD2 are simultaneously programmed and MSB page data PD3 is further programmed.

Figure 29:
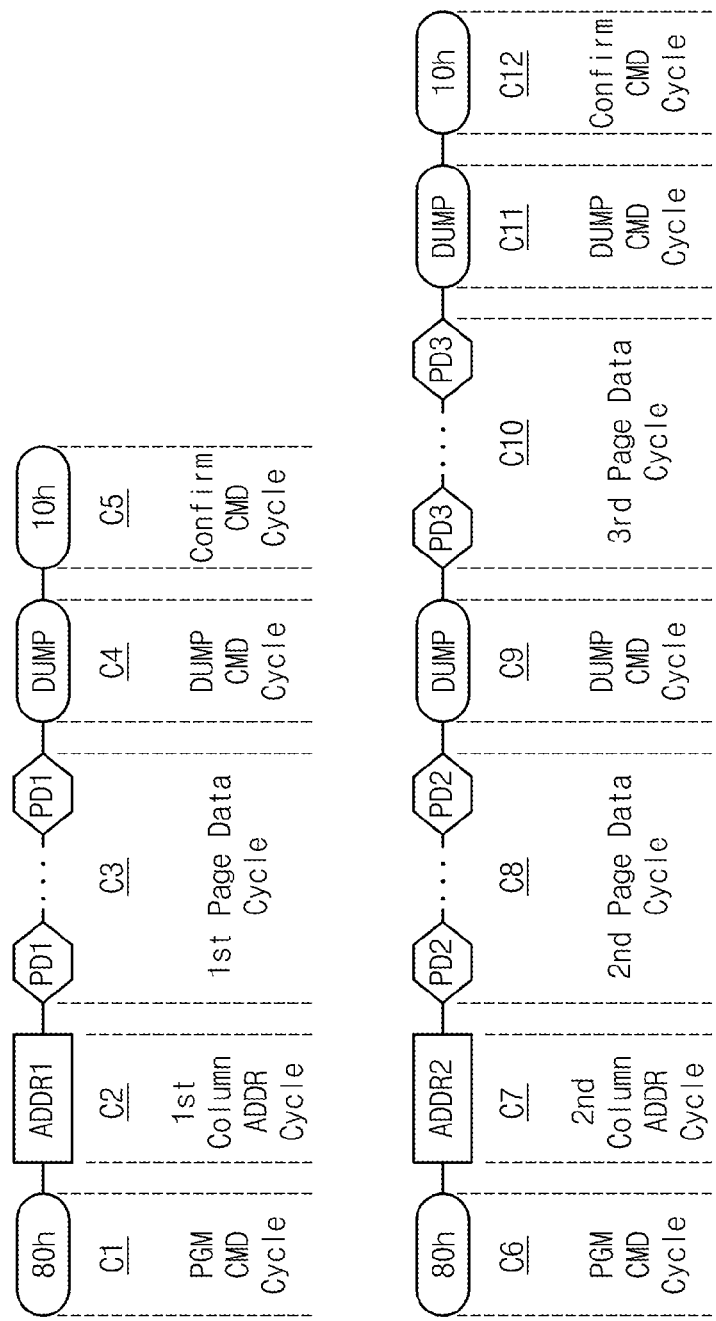

FIG. 29 is a timing diagram illustrating still another example of signals that may be transferred to a three-dimensional nonvolatile memory from a controller at programming Referring collectively to FIGS. 1, 22, and 29, during a first cycle C1, a controller 1300 may transfer a program command 80*h* to a three-dimensional nonvolatile memory 1100.

During a second cycle C2, the controller 1300 may send a first address ADDR1 to the three-dimensional nonvolatile memory 1300. The first address ADDR1 may appoint LSB page.

During a third cycle C3, the controller 1300 may provide LSB page data PD1 to the three-dimensional nonvolatile memory 1100. The three-dimensional nonvolatile memory 1100 may store the input LSB page data PD1 at a cache latch 1131.

During a fourth cycle C4, the controller 1300 may transfer a dump command DUMP to the three-dimensional nonvolatile memory 1100. In response to the dump command CMD, the three-dimensional nonvolatile memory 1100 may load the LSB page data PD1 stored in the cache latch 1131 onto an LSB latch 1133.

During a fifth cycle C5, the controller 1300 may send a confirm command 10*h* to the three-dimensional nonvolatile memory 1100. In response to the confirm command 10*h*, the three-dimensional nonvolatile memory 1100 may program the LSB page data PD1 at memory cells.

During a sixth cycle C6, the controller 1300 may send a program command 80*h* to the three-dimensional nonvolatile memory 1100. Before the program command 80*h* is sent, an initial read operation may be executed.

During a seventh cycle C7, the controller 1300 may send a second address ADDR2 to the three-dimensional nonvolatile memory 1300. The second address ADDR2 may appoint CSB page and MSB page.

During an eighth cycle C8, the controller 1300 may provide CSB page data PD2 to the three-dimensional nonvolatile memory 1100. The three-dimensional nonvolatile memory 1100 may store the input CSB page data PD2 at the cache latch 1131.

During a ninth cycle C9, the controller 1300 may transfer a dump command DUMP to the three-dimensional nonvolatile memory 1100. In response to the dump command CMD, the three-dimensional nonvolatile memory 1100 may load the CSB page data PD2 stored in the cache latch 1131 onto a CSB latch 1135.

During a tenth cycle C10, the controller 1300 may provide MSB page data PD3 to the three-dimensional nonvolatile memory 1100. The three-dimensional nonvolatile memory 1100 may store the input MSB page data PD3 at the cache latch 1131.

During an eleventh cycle C11, the controller 1300 may transfer a dump command DUMP to the three-dimensional nonvolatile memory 1100. In response to the dump command CMD, the three-dimensional nonvolatile memory 1100 may load the MSB page data PD3 stored in the cache latch 1131 onto an MSB latch 1137.

During a twelfth C12, the controller 1300 may send a confirm command 10*h* to the three-dimensional nonvolatile memory 1100. In response to the confirm command 10*h*, the three-dimensional nonvolatile memory 1100 may simultaneously program the CSB page data PD2 and the MSB page data PD3 at memory cells at which the LSB page data PD1 is programmed.

FIG. 30 is a table listing a program addressing scheme for a three-dimensional nonvolatile memory corresponding to the program sequence of FIG. 29. Referring to FIG. 28, two addresses may be assigned to memory cells arranged along a row direction. That is, LSB page data PD1 to be programmed at memory cells arranged along a row direction may be programmed according to one address, and CSB page data PD2 and MSB page data PD3 may be programmed according to the other address.

The program sequence and addressing scheme described with reference to FIGS. 29 and 30 may be applied to embodiments in which LSB page data PD1 are programmed and then CSB page data PD2 and MSB page data PD3 are further programmed at the same time.

Figure 31:
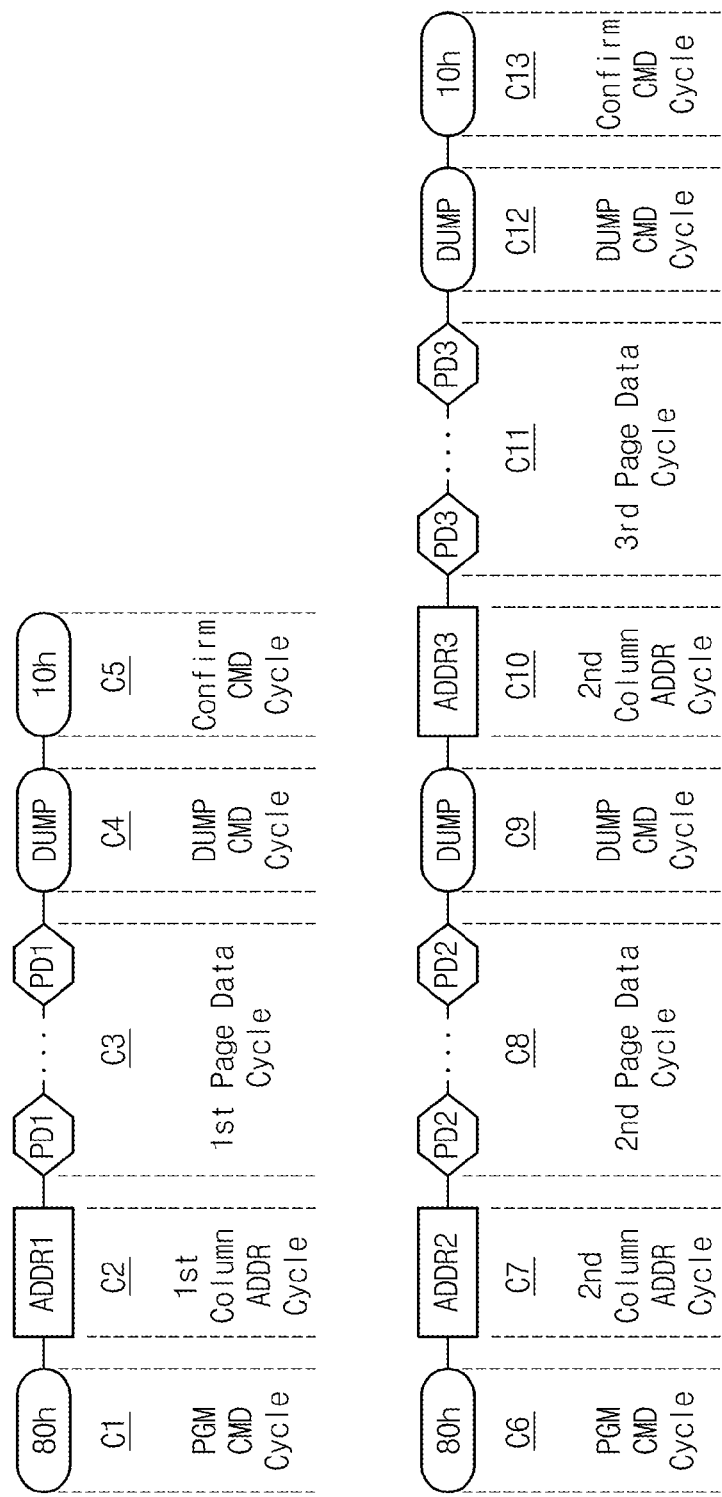

FIG. 31 is a timing diagram illustrating still another example of signals that may be transferred to a three-dimensional nonvolatile memory from a controller during programming Compared with the embodiment of FIG. 29, as described with reference to FIG. 27, LSB page data PD1, CSB page data PD2, and MSB page data PD3 may be programmed according to different addresses.

The address scheme corresponding to the program sequence of FIG. 31 may correspond to the table of FIG. 28.

Figure 32:
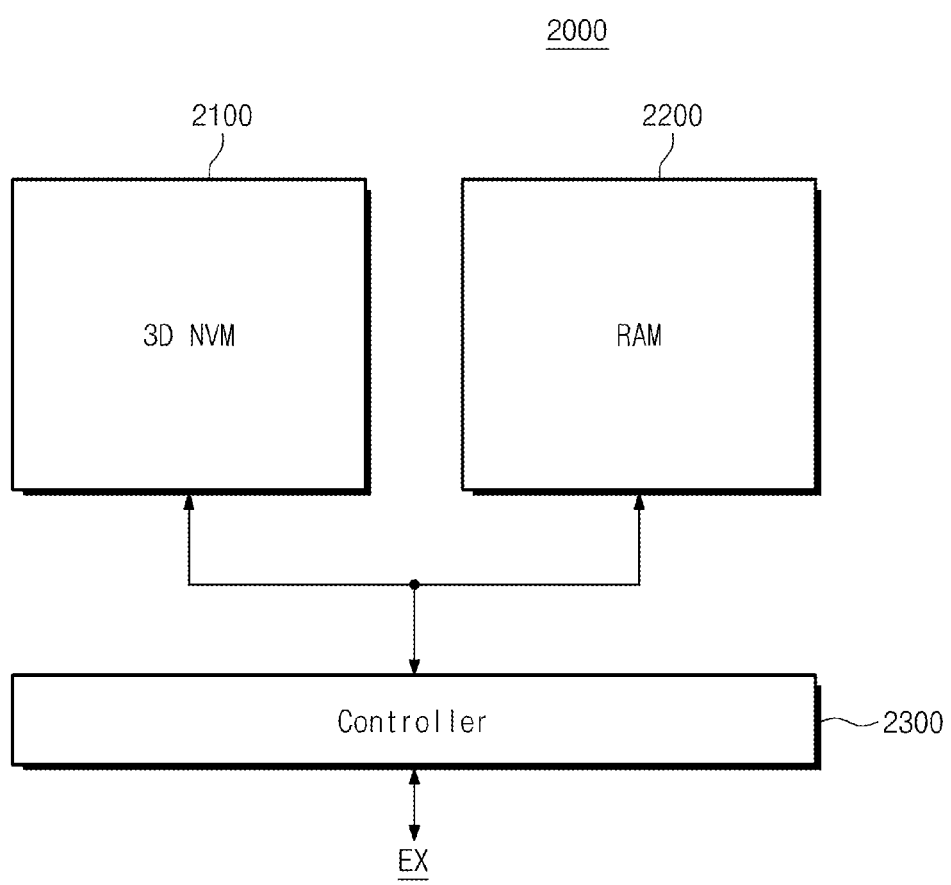
FIGS. 32, 33 and 34 are block diagrams illustrating respective memory systems according to certain embodiments of the inventive concept.

FIG. 32 is a block diagram schematically illustrating a memory system according to another embodiment of the inventive concept. Compared with a memory system 1000 in FIG. 1, a controller 2300 may control a three-dimensional nonvolatile memory 2100 and a random access memory 2200 via a common bus. The three-dimensional nonvolatile memory 2100 and the random access memory 2200 may communicate with the controller 2300 in a time division manner.

Multi-page data accumulated at the random access memory 220 may be transferred directly to the three-dimensional nonvolatile memory 2100 without passing through the controller 2300.

Figure 33:
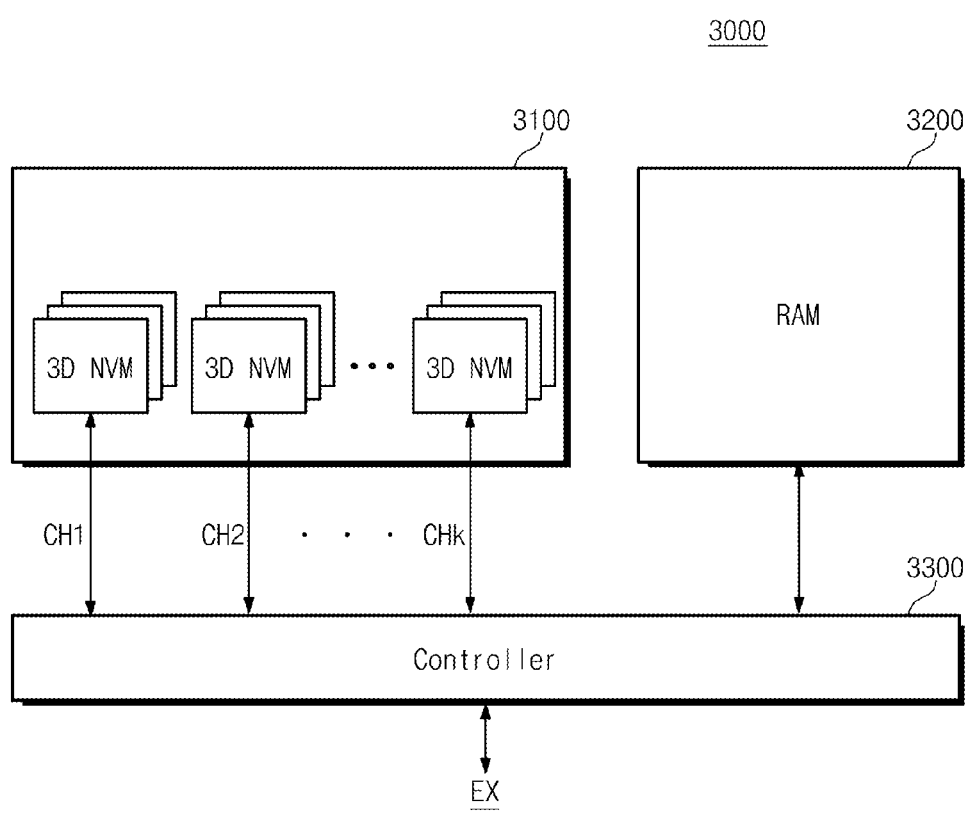

FIG. 33 is a block diagram schematically illustrating a memory system according to still another embodiment of the inventive concept. Compared with a memory system 1000 in FIG. 1, a three-dimensional nonvolatile memory 3100 may communicate with a controller 3300 via a plurality of channels CH1 to CHk. Each channel may be connected with a plurality of three-dimensional nonvolatile memory chips. A random access memory 3200 may store data to be programmed at the three-dimensional nonvolatile memory chips of the three-dimensional nonvolatile memory 3100. If data to be programmed at a specific three-dimensional nonvolatile memory chip of data accumulated at the random access memory 3200 corresponds to multi-page data, the multi-page data may be programmed at the specific three-dimensional nonvolatile memory chip.

In example embodiments, as described with reference to FIG. 32, the three-dimensional nonvolatile memory 3100 and the controller 3300 may be connected via a common bus, and the plurality of channels CH1 to CHk may occupy the common bus in a time division manner.

In example embodiments, as described with reference to FIG. 32, the three-dimensional nonvolatile memory 3100 and the random access memory 3200 may be connected with the controller 3300 via a common bus, and may communicate with the controller 3300 in a time division manner.

Like the three-dimensional nonvolatile memory 3100, the random access memory 3200 may include a plurality of random access memory chips. The plurality of random access memory chips may communicate with the controller 3200 via a plurality of channels or a common channel. At least one random access memory chip may be connected to each channel. When the random access memory chips communicate with the controller 3200 via the plurality of channels, channels of the random access memory chips may correspond to the channels CH1 to CHk of the three-dimensional nonvolatile memory chips, respectively. At least one random access memory chip connected to one channel may store data to be programmed in at least one three-dimensional nonvolatile memory chip connected to a channel.

Figure 34:
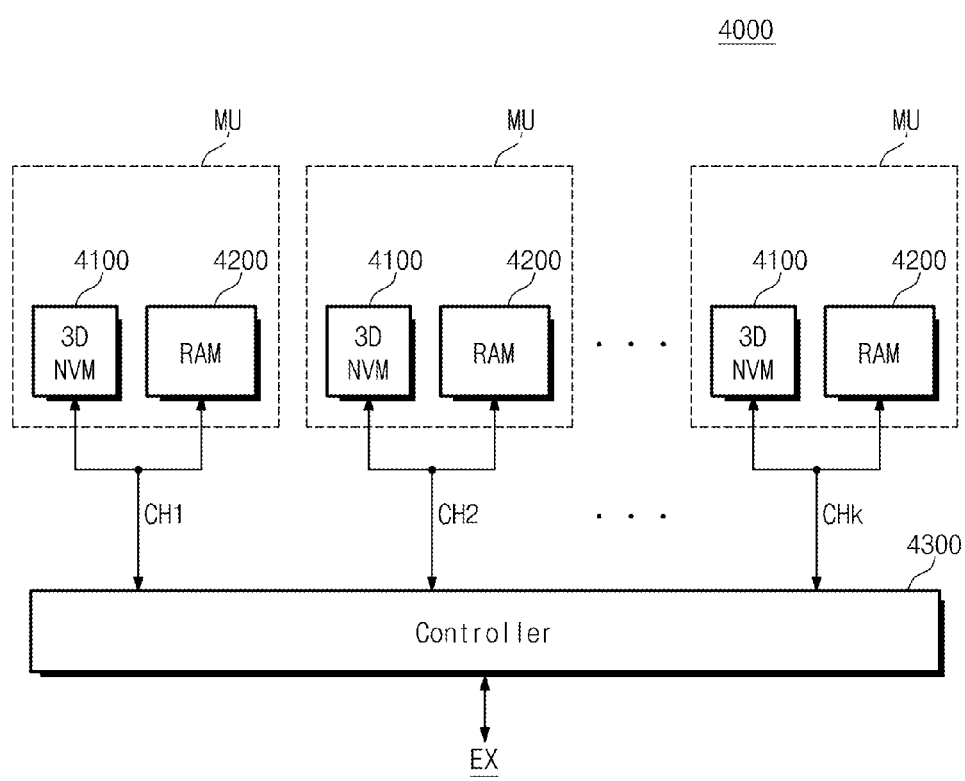

FIG. 34 is a block diagram schematically illustrating a memory system according to still another embodiment of the inventive concept. Compared with a memory system 1000 in FIG. 1, a memory system 4000 may include a plurality of memory units MU and a controller 4300. The plurality of memory units MU may communicate with the controller 4300 via a plurality of channels CH1 to CHk.

Each of the memory units MU may include at least one three-dimensional nonvolatile memory chip 4100 and a random access memory 4200. In each memory unit MU, at least one three-dimensional nonvolatile memory chip 4100 and a random access memory 4200 may communicate with the controller 4300 via a common channel. In each memory unit MU, at least one three-dimensional nonvolatile memory chip 4100 and a random access memory 4200 may occupy a common channel in a time division manner.

Figure 35:
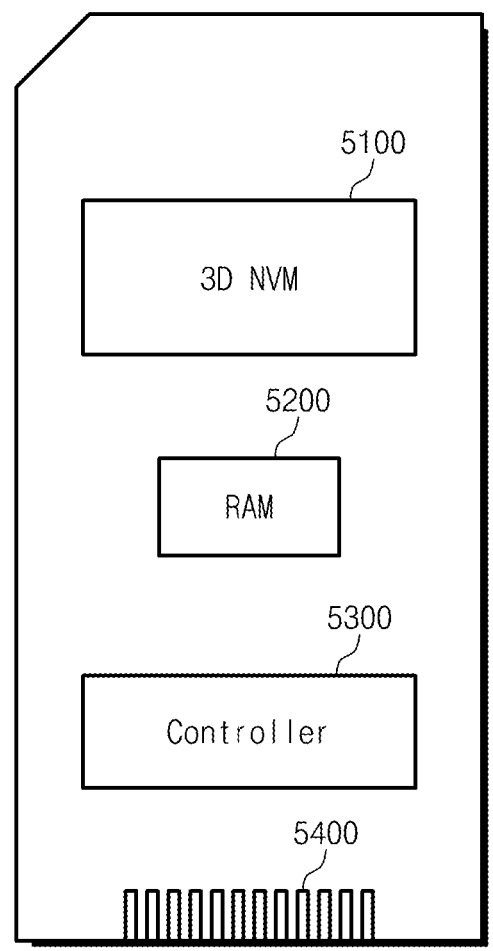
FIG. 35 is a diagram illustrating a memory card according to an embodiment of the inventive concept.

FIG. 35 is a diagram illustrating a memory card according to an embodiment of the inventive concept. Referring to FIG. 35, a memory card 5000 may include a three-dimensional nonvolatile memory 5100, a random access memory 5200, a controller 5300, and a connector 5400.

The random access memory 5200 may store data to be programmed at the three-dimensional nonvolatile memory 5100. If data accumulated at the random access memory 5200 corresponds to multi-page data, the multi-page data may be programmed at the three-dimensional nonvolatile memory 5100.

The memory card 5000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and so on.

Figure 36:
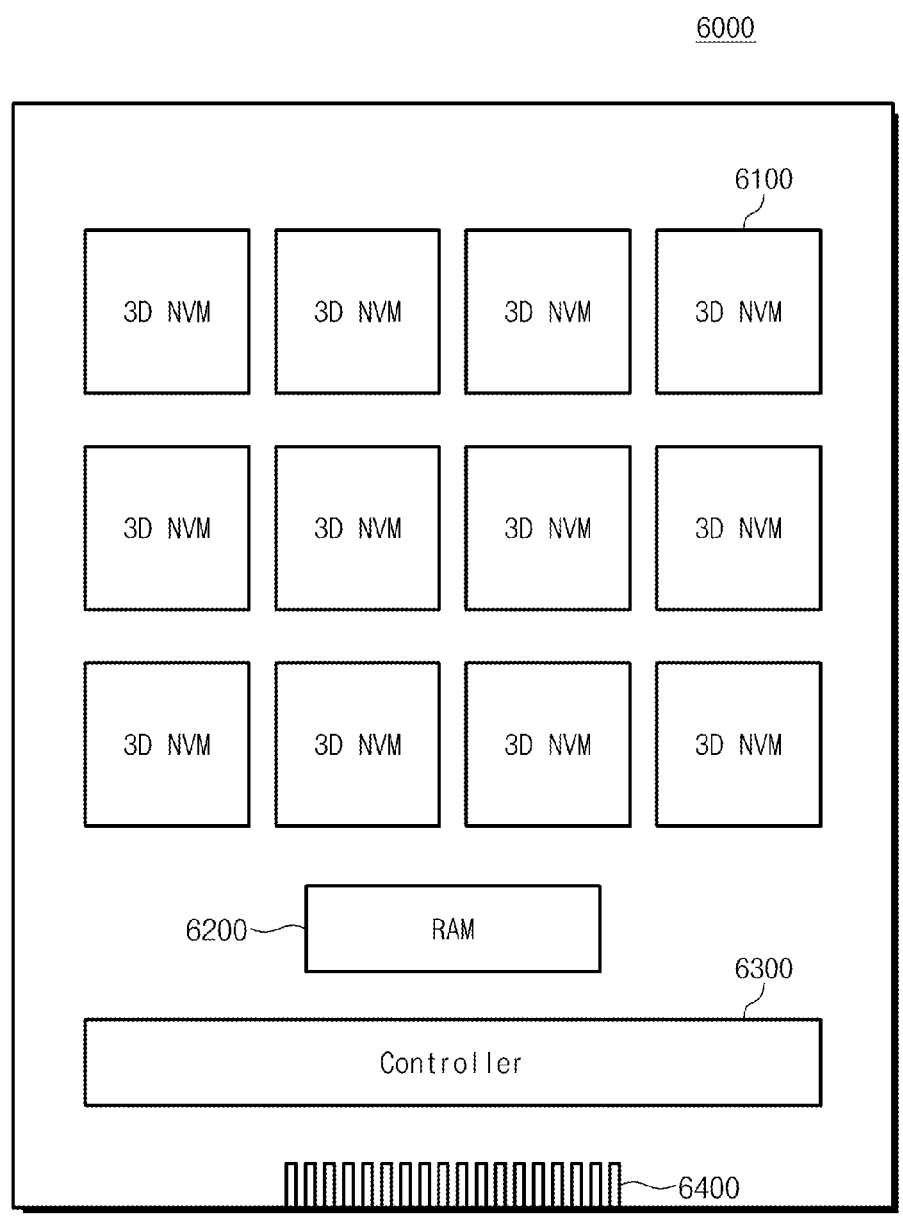
FIG. 36 is a diagram illustrating a solid state drive (SSD) according to an embodiment of the inventive concept.

FIG. 36 is a diagram illustrating a solid state drive according to an embodiment of the inventive concept. Referring to FIG. 36, a solid state drive 6000 may include a plurality of three-dimensional nonvolatile memories 6100, a random access memory 6200, a controller 6300, and a connector 6400.

The random access memory 6200 may store data to be programmed at the three-dimensional nonvolatile memories 6100. If data accumulated at the random access memory 6200 corresponds to multi-page data, the multi-page data may be programmed at the three-dimensional nonvolatile memories 6100.

Figure 37:
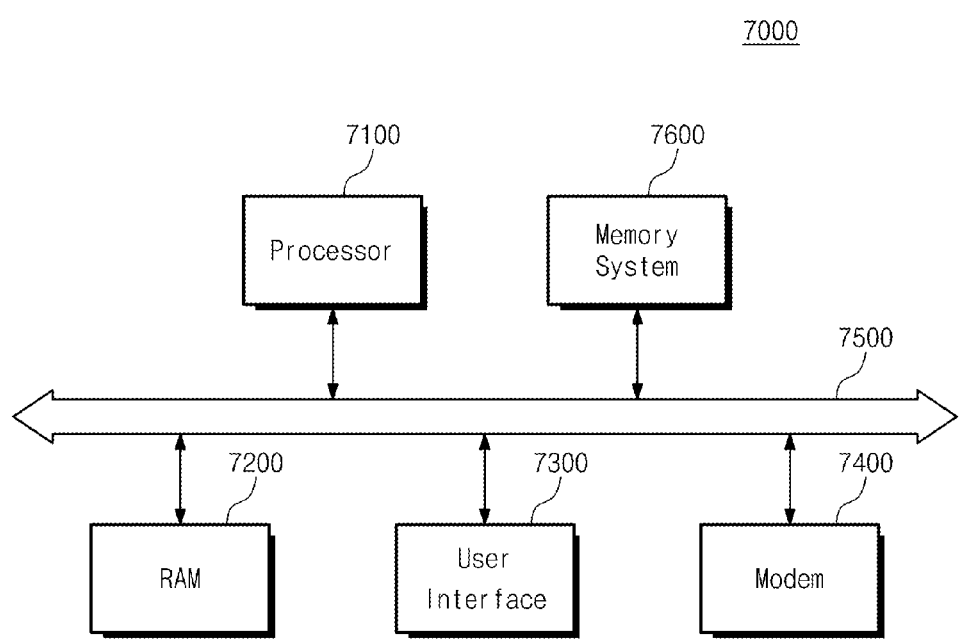
FIG. 37 is a block diagram illustrating a computational system according to an embodiment of the inventive concept.

FIG. 37 is a block diagram illustrating a computational system according to an embodiment of the inventive concept. Referring to FIG. 37, a computational system 7000 may include a central processing unit 7100, a RAM 7200, a user interface 7300, a modem 7400, a system bus 7500, and a memory system 7600.

The memory system 7600 may be connected electrically with the elements 7100 to 7400 via the system bus 7500. Data provided via the user interface 7300, data processed by the central processing unit 7100, or data received through the modem 7400 may be stored in the memory system 7600.

The memory system 7600 may be one of memory systems 1000 to 4000 described with reference to FIGS. 1 and 32 to 34.

As has been explained in the context of certain embodiments of the inventive concept, the number of program (NOP) operations generated when data is programmed to memory cells of a three-dimensional memory cell array may be reduced. Accordingly, program disturbance forced upon connected word lines at a same layer during programming, as well as read disturbance generated during program verifying may be reduced. These results improve memory cell endurance. As a result, it is possible to provide a three-dimensional nonvolatile memory having the improved reliability, a memory system including the three-dimensional nonvolatile memory, and a program method thereof.

While the inventive concept has been described with reference to exemplary embodiments, it will be apparent to those skilled in the art that various changes and modifications may be made without departing from the scope of the following claims. Therefore, it should be understood that the above embodiments are not limiting, but illustrative.

What is claimed is:

1. A program method for a memory system including a three-dimensional nonvolatile memory having a page buffer and multi-level memory cells arranged along a row direction, and a random access memory, the method comprising:
   receiving externally provided program data;
   determining whether the received program data is whole data associated with the memory cells and corresponding to multi-page data; and
   upon determining that the received program data is whole data programming the program data by loading the multi-page data to the page buffer bypassing the random access memory and then simultaneously programming the bits of the multi-page data from the page buffer to the memory cells,
   else storing the received program data in the random access memory.

2. The program method of claim 1, wherein the multi-level memory cells are configured to store at least three-bit data, such that the whole data includes at least a Least Significant Bit (LSB) page, a Central Significant Bit (CSB) page, and a Most Significant Bit (MSB) page.

3. The program method of claim 2, wherein the programming of the program data comprises:
   transferring a program command with a corresponding address indicating that the memory cells are arranged along the row direction to the three-dimensional nonvolatile memory;
   sequentially transferring the LSB page, the CSB page, and the MSB page to the three-dimensional nonvolatile memory; and
   transferring a confirm command indicating a start of a program operation to the three-dimensional nonvolatile memory.

4. The program method of claim 3, wherein the three-dimensional nonvolatile memory further includes a cache latch configured to store the LSB page, CSB page, and MSB page, and the programming of the program data further comprises:
   transferring a dump command to the three-dimensional nonvolatile memory following transfer of the respective LSB page, CSB page, and MSB page, such that the cache latch dumps one of the LSB page, CSB page, and MSB page to a respective latch in response to the dump command.

5. The program method of claim 1, wherein each one of the memory cells is identified during a program operation by a single address and is identified by two or more different addresses during a read operation.

6. A program method for a memory system including a controller, a three-dimensional nonvolatile memory having a page buffer and a row of multi-level memory cells, and a random access memory, the method comprising:
   receiving externally provided multi-page program data in the controller;
   storing the received program data in the random access memory until the received program data stored in the random access memory constitutes an entirety of multi-page data for the row of memory cells, the entirety of the multi-page data including a plurality of different pages, the plurality of different pages including at least a least significant bit (LSB) page and a most significant bit (MSB) page;
   loading the multi-page data to the page buffer; and
   simultaneously programming the plurality of different pages of the multi-page data from the page buffer to the row of memory cells.

7. The program method of claim 6, wherein the row of memory cells are configured to store at least three-bit data including the LSB page, a Central Significant Bit (CSB) page, and the MSB page.

8. The program method of claim 7, further comprising:
   transferring a program command with a corresponding address indicating that the memory cells are arranged along a row direction from the controller to the three-dimensional nonvolatile memory;
   sequentially transferring the LSB page, the CSB page, and the MSB page from the controller to the three-dimensional nonvolatile memory; and
   transferring a confirm command indicating a start of a program operation that programs the LSB page, the CSB page and the MSB page to the three-dimensional nonvolatile memory.

9. The program method of claim 7, wherein the loading of the LSB page, the CSB page and the MSB page from the random access memory to the page buffer is simultaneously performed.

10. The program method of claim 7, wherein the loading of the LSB page from the random access memory to the page buffer is performed at least partially while the CSB page is being received by the controller, and the loading of the CSB page from the random access memory to the page buffer is performed at least partially while the MSB page is being received by the controller.

11. The program method of claim 6, wherein each one of the memory cells is identified during a program operation by a single address and is identified by two or more different addresses during a read operation.

12. A program method for a memory system including a controller, a three-dimensional nonvolatile memory having a page buffer and N-bit memory cells arranged along a row direction, and a random access memory, the method comprising:
   receiving a first bit of N-bit data in the controller and storing the first bit of the N-bit data in the random access memory;
   after storing the first bit of the N-bit data in the random access memory, receiving a second bit of the N-bit data in the controller, wherein the combination of at least the first bit and second bit of the N-bit data is whole data associated with the memory cells and corresponding to multi-page data;
   loading the multi-page data to the page buffer, wherein the loading of the multi-page data to the page buffer includes transferring the first bit of the N-bit data from the random access memory to the page buffer, and directly transferring the second bit of the N-bit data from the controller to the page buffer by bypassing the random access memory; and
   simultaneously programming the multi-page data from the page buffer to the memory cells.

13. The program method of claim 12, further comprising:
after storing the first bit of the N-bit data in the random access memory, receiving a third bit of the N-bit data in the controller, wherein the combination of at least the first bit, the second bit, and the third bit of the N-bit data is whole data associated with the memory cells and corresponding to multi-page data.

14. The program method of claim 13, wherein the loading of the multi-page data to the page buffer further includes directly transferring the third bit of the N-bit data from the controller to the page buffer by bypassing the random access memory.

15. The program method of claim 12, wherein the transferring of the first bit of the N-bit data from the random access memory to the page buffer occurs at least partially while the second bit of the N-bit data is being directly transferred from the controller to the page buffer.

16. The program method of claim 12, wherein each one of the memory cells is identified during a program operation by a single address and is identified by two or more different addresses during a read operation.

17. A program method for a memory system including a controller, a three-dimensional nonvolatile memory having a page buffer and N-bit memory cells arranged along a row direction, and a random access memory, the method comprising:
receiving a first bit of N-bit data in the controller, directly loading the first bit of N-bit data to the page buffer without passing through the random access memory, and then programming the first bit of the N-bit data to the memory cells;
after programming the first bit of the N-bit data to the memory cells, receiving a second bit of the N-bit data in the controller and storing the second bit of the N-bit data in the random access memory;
after storing the second bit of the N-bit data in the random access memory, transferring the second bit of the N-bit data from the random access memory to the page buffer;
receiving a third bit of the N-bit data in the controller and directly loading the third bit of N-bit data to the page buffer without passing through the random access memory, wherein the combination of the first bit, the second bit and the third bit of the N-bit data is whole data associated with the memory cells and corresponds to multi-page data; and
simultaneously programming the second bit and third bit of the N-bit data from the page buffer to the memory cells.

18. The program method of claim 15, wherein the transferring of the second bit of the N-bit data from the random access memory to the page buffer occurs at least in part while the third bit of N-bit data is being directly transferred to the page buffer.

19. A program method for a memory system including a controller, a three-dimensional nonvolatile memory having a page buffer and N-bit memory cells arranged along a row direction, and a random access memory, the method comprising:
receiving a first bit of N-bit data in the controller and storing the first bit of N-bit data in the random access memory;
receiving a second bit of N-bit data in the controller and storing the second bit of N-bit data in the random access memory;
simultaneously loading the first bit and second bit of the N-bit data from the random access memory to the page buffer, and then simultaneously programming the first bit and second bit of the N-bit data from the page buffer to the memory cells;
after simultaneously programming the first bit and second bit of the N-bit data from the page buffer to the memory cells, receiving a third bit of N-bit data in the controller, storing the third bit of N-bit data in the random access memory, loading the third bit of the N-bit data from the random access memory to the page buffer, and then programming the third bit of the N-bit data from the page buffer to the memory cells,
wherein the combination of the first bit, the second bit and the third bit of the N-bit data is whole data associated with the memory cells and corresponds to multi-page data.

20. The program method of claim 19, wherein each one of the memory cells is identified during a program operation by a single address and is
identified by two or more different addresses during a read operation.

* * * * *